(12) United States Patent
Chan et al.

(10) Patent No.: US 10,615,324 B2
(45) Date of Patent: Apr. 7, 2020

(54) TINY 6 PIN SIDE VIEW SURFACE MOUNT LED

(71) Applicant: CREE HUIZHOU SOLID STATE LIGHTING COMPANY LIMITED, Huizhou, Guangdong (CN)

(72) Inventors: Chi Keung Alex Chan, Sheung Shui (HK); Yue Kwong Victor Lau, Laguna (HK); Chak Hau Charles Pang, Fanling (HK); Zhenyu Zhong, Tko (HK)

(73) Assignee: Cree Huizhou Solid State Lighting Company Limited, Huizhou (CN)

(*) Notice: Subject to any disclaimer, the term of this patent is extended or adjusted under 35 U.S.C. 154(b) by 0 days.

(21) Appl. No.: 14/302,113

(22) Filed: Jun. 11, 2014

(65) Prior Publication Data

US 2014/0367712 A1 Dec. 18, 2014

(30) Foreign Application Priority Data

Jun. 14, 2013 (CN) .......................... 2013 1 0237831

(51) Int. Cl.
*H01L 33/62* (2010.01)
*H01L 25/075* (2006.01)
*H01L 33/48* (2010.01)

(52) U.S. Cl.
CPC .......... *H01L 33/62* (2013.01); *H01L 25/0753* (2013.01); *H01L 33/486* (2013.01); *H01L 2224/48247* (2013.01)

(58) Field of Classification Search
CPC ..... H01L 2924/12041; H01L 33/52–62; H01L 33/486; H01L 25/0753; H01L 21/44;
(Continued)

(56) References Cited

U.S. PATENT DOCUMENTS

| 3,805,937 A | 4/1974 | Hatanaka et al. |
| 3,875,456 A | 4/1975 | Kano et al. |

(Continued)

FOREIGN PATENT DOCUMENTS

| CN | 2535926 | 2/2003 |
| CN | 1492521 A | 4/2004 |

(Continued)

OTHER PUBLICATIONS

Translation of JP2004071675.*

(Continued)

*Primary Examiner* — Eric A. Ward
*Assistant Examiner* — Eric K Ashbahian
(74) *Attorney, Agent, or Firm* — Ferguson Case Orr Paterson LLP (57) ABSTRACT

A side view surface mount light emitting device is disclosed. The light emitting device comprises a side oriented package comprising a floor and a plurality of light emitting diodes (LEDs) mounted on the floor. The device further includes a plurality of contact pins in electrical contact, such that the plurality of contact pins protrude from a side of the package, in which at least one of the contact pins is oriented in a direction opposite the remaining contact pins. The LEDs of the device are disposed to emit light in a direction parallel to said mount surface. Some configurations also include a plurality of bond pads, on or a part of the floor, to facilitate electrical connection between the LEDs and the contact pins, in which adjacent bond pads have a tapered shape such that the widest portion of a first bond pad is adjacent to the narrowest portion of a second bond pad. Displays including such devices are also disclosed.

15 Claims, 3 Drawing Sheets

(58) Field of Classification Search
CPC ............... H01L 21/00; H01L 21/48; H01L 2224/48247; H01L 21/50; F21Y 2113/13; F21Y 2115/10; H05K 1/181; F21V 23/001

See application file for complete search history.

(56) References Cited

U.S. PATENT DOCUMENTS

| | | |
|---|---|---|
| 3,927,290 A | 12/1975 | Denley |
| 4,081,764 A | 3/1978 | Christmann et al. |
| 4,120,026 A | 10/1978 | Tsuchihashi et al. |
| 4,325,146 A | 4/1982 | Lennington |
| 4,346,275 A | 8/1982 | Iwakira |
| 4,408,157 A | 10/1983 | Beaubien |
| 4,420,398 A | 12/1983 | Castino |
| 4,476,620 A | 10/1984 | Ohki et al. ............. 438/33 |
| 4,710,699 A | 12/1987 | Miyamoto |
| 4,843,280 A | 6/1989 | Lumbard |
| 4,866,005 A | 9/1989 | Davis et al. |
| 5,087,883 A | 2/1992 | Hoffman |
| 5,094,185 A | 3/1992 | Simopoulos et al. |
| 5,226,052 A | 7/1993 | Tanaka et al. ............. 372/36 |
| 5,264,997 A | 11/1993 | Hutchisson et al. |
| RE34,861 E | 2/1995 | Davis et al. |
| 5,407,799 A | 4/1995 | Studier |
| 5,410,519 A | 4/1995 | Hall et al. |
| 5,477,436 A | 12/1995 | Bertling et al. |
| 5,549,762 A | 8/1996 | Cantarini ............. 136/249 |
| 5,563,849 A | 10/1996 | Hall et al. |
| 5,585,640 A | 12/1996 | Huston et al. |
| 5,614,734 A | 9/1997 | Guido ............. 257/94 |
| 5,723,391 A | 3/1998 | Hunter et al. |
| 5,726,896 A | 3/1998 | Jia et al. |
| 5,803,579 A | 9/1998 | Turnbull et al. |
| 5,847,507 A | 12/1998 | Butterworth et al. ........ 313/512 |
| 5,851,063 A | 12/1998 | Doughty et al. |
| 5,959,316 A | 9/1999 | Lowery ............. 357/98 |
| 5,962,971 A | 10/1999 | Chen |
| 6,066,861 A | 5/2000 | Hohn et al. ............. 257/99 |
| 6,076,936 A | 6/2000 | George |
| 6,084,250 A | 7/2000 | Justel et al. ............. 257/89 |
| 6,091,084 A | 7/2000 | Fujii |
| 6,095,666 A | 8/2000 | Salam |
| 6,132,072 A | 10/2000 | Turnbull et al. |
| 6,144,536 A | 11/2000 | Zimmerman et al. |
| 6,200,917 B1 | 3/2001 | Carter et al. |
| 6,212,213 B1 | 4/2001 | Weber et al. |
| 6,218,680 B1 | 4/2001 | Carter et al. |
| 6,222,207 B1 | 4/2001 | Carter-Coman et al. ........ 257/98 |
| 6,234,648 B1 | 5/2001 | Broner et al. ............. 362/235 |
| 6,245,259 B1 | 6/2001 | Höhn et al. |
| 6,252,254 B1 | 6/2001 | Soules et al. ............. 257/89 |
| 6,255,670 B1 | 7/2001 | Srivastava et al. ............. 257/89 |
| 6,278,135 B1 | 8/2001 | Srivastava et al. ............. 257/98 |
| 6,292,901 B1 | 9/2001 | Lys et al. |
| 6,294,800 B1 | 9/2001 | Duggal et al. ............. 257/89 |
| 6,319,425 B1 | 11/2001 | Tasaki et al. |
| 6,335,538 B1 | 1/2002 | Prutchi et al. |
| 6,337,536 B1 | 1/2002 | Matsubara et al. |
| 6,340,824 B1 | 1/2002 | Komoto et al. |
| 6,346,771 B1 | 2/2002 | Salam ............. 313/499 |
| 6,348,766 B1 | 2/2002 | Ohishi et al. |
| 6,350,041 B1 | 2/2002 | Tarsa et al. ............. 362/231 |
| 6,357,889 B1 | 3/2002 | Duggal et al. |
| 6,373,188 B1 | 4/2002 | Johnson et al. |
| 6,394,621 B1 | 5/2002 | Hanewinkel |
| 6,395,572 B1 | 5/2002 | Tsutsui et al. ............. 438/46 |
| 6,396,080 B2 | 5/2002 | Carter et al. |
| 6,403,982 B2 | 6/2002 | Carter et al. |
| 6,429,583 B1 | 8/2002 | Levinson et al. |
| 6,441,558 B1 | 8/2002 | Muthu et al. |
| 6,480,299 B1 | 11/2002 | Drakopoulos et al. |
| 6,486,499 B1 | 11/2002 | Krames et al. ............. 257/81 |
| 6,490,104 B1 | 12/2002 | Gleckman et al. |
| 6,495,862 B1 | 12/2002 | Okazaki et al. ............. 257/103 |
| 6,501,100 B1 | 12/2002 | Srivastava et al. ............. 257/79 |
| 6,504,179 B1 | 1/2003 | Ellens et al. ............. 257/88 |
| 6,504,301 B1 | 1/2003 | Lowery |
| 6,513,949 B1 | 2/2003 | Marshall et al. ............. 362/231 |
| 6,522,065 B1 | 2/2003 | Srivastava et al. |
| 6,538,371 B1 | 3/2003 | Duggal et al. |
| 6,547,249 B2 | 4/2003 | Collins, III et al. |
| 6,550,949 B1 | 4/2003 | Bauer et al. |
| 6,552,495 B1 | 4/2003 | Chang |
| 6,563,142 B2 | 5/2003 | Shen et al. |
| 6,573,537 B1 | 6/2003 | Steigerwald et al. ........ 257/103 |
| 6,576,488 B2 | 6/2003 | Collins, III et al. |
| 6,576,930 B2 | 6/2003 | Reeh et al. ............. 257/98 |
| 6,577,073 B2 | 6/2003 | Shimizu et al. ............. 315/246 |
| 6,578,986 B2 | 6/2003 | Swaris et al. |
| 6,592,810 B2 | 7/2003 | Nishida et al. |
| 6,600,175 B1 | 7/2003 | Baretz et al. |
| 6,600,324 B2 | 7/2003 | St-Germain |
| 6,603,258 B1 | 8/2003 | Mueller-Mach et al. |
| 6,608,485 B2 | 8/2003 | St-Germain |
| 6,610,598 B2 | 8/2003 | Chen |
| 6,616,862 B2 | 9/2003 | Srivastava et al. |
| 6,624,350 B2 | 9/2003 | Nixon et al. |
| 6,635,503 B2 | 10/2003 | Andrews et al. |
| 6,636,003 B2 | 10/2003 | Rahm et al. |
| 6,639,247 B2 | 10/2003 | Carter et al. |
| 6,642,618 B2 | 11/2003 | Yagi et al. |
| 6,642,652 B2 | 11/2003 | Collins et al. ............. 313/512 |
| 6,642,666 B1 | 11/2003 | St-Germain |
| 6,657,236 B1 | 12/2003 | Thibeault et al. ............. 257/98 |
| 6,685,852 B2 | 2/2004 | Setlur et al. |
| 6,686,676 B2 | 2/2004 | McNulty et al. ............. 323/112 |
| 6,686,691 B1 | 2/2004 | Mueller et al. |
| 6,690,700 B2 | 2/2004 | Takeuchi et al. |
| 6,692,136 B2 | 2/2004 | Marshall et al. ............. 362/231 |
| 6,703,173 B2 | 3/2004 | Lu et al. |
| 6,707,247 B2 | 3/2004 | Murano |
| 6,712,486 B1 | 3/2004 | Popovich et al. |
| 6,734,467 B2 | 5/2004 | Schlereth et al. ............. 257/89 |
| 6,737,801 B2 | 5/2004 | Ragle |
| 6,744,073 B1 | 6/2004 | Nakata ............. 257/81 |
| 6,744,194 B2 | 6/2004 | Fukasawa et al. |
| 6,762,563 B2 | 7/2004 | St-Germain |
| 6,784,460 B2 | 8/2004 | Ng et al. ............. 257/95 |
| 6,784,463 B2 | 8/2004 | Camras et al. |
| 6,791,119 B2 | 9/2004 | Slater et al. ............. 257/99 |
| 6,791,257 B1 | 9/2004 | Sato et al. |
| 6,800,500 B2 | 10/2004 | Coman et al. ............. 438/22 |
| 6,817,735 B2 | 11/2004 | Shimizu et al. |
| 6,821,804 B2 | 11/2004 | Thibeault et al. ............. 438/29 |
| 6,828,596 B2 | 12/2004 | Steigerwald et al. ........ 257/99 |
| 6,841,804 B1 | 1/2005 | Chen et al. |
| 6,851,834 B2 | 2/2005 | Leysath |
| 6,880,954 B2 | 4/2005 | Ollett et al. |
| 6,882,101 B2 | 4/2005 | Ragle |
| 6,885,035 B2 | 4/2005 | Bhat et al. |
| 6,890,085 B2 | 5/2005 | Hacker |
| 6,900,473 B2 | 5/2005 | Yoshitake et al. ............. 257/95 |
| 6,914,267 B2 | 7/2005 | Fukasawa et al. |
| 6,936,857 B2 | 8/2005 | Doxsee et al. |
| 6,936,862 B1 | 8/2005 | Chang et al. |
| 6,946,309 B2 | 9/2005 | Camras et al. ............. 438/26 |
| 6,957,899 B2 | 10/2005 | Jiang et al. |
| 6,967,116 B2 | 11/2005 | Negley |
| 6,972,438 B2 | 12/2005 | Li et al. ............. 257/98 |
| 6,995,400 B2 | 2/2006 | Mizuyoshi |
| 6,998,281 B2 | 2/2006 | Taskar et al. |
| 7,005,679 B2 | 2/2006 | Tarsa et al. ............. 257/89 |
| 7,008,078 B2 | 3/2006 | Shimizu et al. |
| 7,009,199 B2 | 3/2006 | Hall ............. 257/14 |
| 7,009,343 B2 | 3/2006 | Lim et al. |
| 7,014,336 B1 | 3/2006 | Ducharme et al. |
| 7,015,511 B2 | 3/2006 | Sakai et al. ............. 257/94 |
| 7,023,019 B2 | 4/2006 | Maeda et al. |
| 7,048,412 B2 | 5/2006 | Martin et al. |
| 7,061,454 B2 | 6/2006 | Sasuga et al. ............. 345/82 |
| 7,064,355 B2 | 6/2006 | Camras et al. |
| 7,066,623 B2 | 6/2006 | Lee et al. |
| 7,066,626 B2 | 6/2006 | Omata |

(56) References Cited

U.S. PATENT DOCUMENTS

| | | |
|---|---|---|
| 7,083,302 B2 | 8/2006 | Chen et al. ............... 362/231 |
| 7,091,653 B2 | 8/2006 | Ouderkirk et al. .......... 313/113 |
| 7,093,958 B2 | 8/2006 | Coushaine |
| 7,095,056 B2 | 8/2006 | Vitta et al. |
| 7,102,172 B2 | 9/2006 | Lynch et al. |
| 7,126,274 B2 | 10/2006 | Shimizu et al. ............ 313/512 |
| 7,132,691 B1 | 11/2006 | Tanabe et al. ................. 257/79 |
| 7,135,664 B2 | 11/2006 | Vornsand et al. |
| 7,153,015 B2 | 12/2006 | Brukilacchio |
| 7,154,125 B2 | 12/2006 | Koide et al. ................. 257/95 |
| 7,164,231 B2 | 1/2007 | Choi et al. ................. 313/587 |
| 7,207,691 B2 | 4/2007 | Lee et al. |
| 7,213,940 B1 | 5/2007 | Van De Ven et al. |
| 7,213,942 B2 | 5/2007 | Jiang et al. |
| 7,215,074 B2 | 5/2007 | Shimizu et al. |
| 7,221,044 B2 | 5/2007 | Fan et al. |
| 7,232,212 B2 | 6/2007 | Iwase |
| 7,239,085 B2 | 7/2007 | Kawamura ................. 313/582 |
| 7,244,630 B2 | 7/2007 | Krames et al. ................ 438/47 |
| 7,250,715 B2 | 7/2007 | Meuller et al. |
| 7,255,457 B2 | 8/2007 | Ducharme et al. |
| 7,256,557 B2 | 8/2007 | Lim et al. |
| 7,258,816 B2 | 8/2007 | Tamaki et al. ......... 252/301.4 F |
| 7,329,024 B2 | 2/2008 | Lynch et al. |
| 7,332,746 B1 | 2/2008 | Takahashi et al. ............ 257/98 |
| 7,334,917 B2 | 2/2008 | Laski |
| 7,348,212 B2 | 3/2008 | Schiaffino et al. .......... 438/106 |
| 7,358,954 B2 | 4/2008 | Negley et al. |
| 7,364,338 B2 | 4/2008 | Chang ........................ 362/612 |
| 7,365,485 B2 | 4/2008 | Fukasawa et al. |
| 7,387,405 B2 | 6/2008 | Ducharme et al. |
| 7,422,504 B2 | 9/2008 | Maeda et al. |
| 7,453,195 B2 | 11/2008 | Radkov |
| 7,462,502 B2 | 12/2008 | Paolini et al. |
| 7,474,044 B2 | 1/2009 | Ge |
| 7,479,662 B2 | 1/2009 | Soules et al. |
| 7,633,097 B2 | 12/2009 | Kim et al. |
| 7,649,209 B2 | 1/2010 | Hussell et al. ................. 257/98 |
| 7,709,282 B2 | 5/2010 | Fukshima et al. ............. 438/26 |
| 7,869,483 B2 | 1/2011 | Uchida et al. ................. 372/99 |
| 8,067,254 B2 | 11/2011 | Camras et al. ................ 438/27 |
| 8,328,376 B2 | 12/2012 | Negley et al. |
| 8,896,197 B2* | 11/2014 | Negley ....................... 313/501 |
| 2001/0000622 A1 | 5/2001 | Reeh et al. .................... 257/98 |
| 2001/0002049 A1 | 5/2001 | Reeh et al. |
| 2002/0001192 A1 | 1/2002 | Suehiro et al. ............... 362/240 |
| 2002/0015013 A1 | 2/2002 | Ragle |
| 2002/0028527 A1 | 3/2002 | Maeda et al. |
| 2002/0039002 A1 | 4/2002 | Fukasawa et al. |
| 2002/0063520 A1 | 5/2002 | Yu et al. |
| 2002/0070681 A1 | 6/2002 | Shimizu et al. ............. 315/246 |
| 2002/0087532 A1 | 7/2002 | Barritz et al. |
| 2002/0123164 A1 | 9/2002 | Slater et al. .................. 438/39 |
| 2002/0015835 A1 | 10/2002 | Fujiwara |
| 2002/0140880 A1 | 10/2002 | Weindorf et al. ............. 349/70 |
| 2002/0149314 A1 | 10/2002 | Takahashi et al. |
| 2002/0153835 A1 | 10/2002 | Fujiwara et al. |
| 2002/0163302 A1 | 11/2002 | Nitta |
| 2002/0171911 A1 | 11/2002 | Maegawa |
| 2002/0185966 A1 | 12/2002 | Murano ...................... 313/501 |
| 2003/0025449 A1 | 2/2003 | Rossner |
| 2003/0026096 A1 | 2/2003 | Zwaschka et al. |
| 2003/0030063 A1 | 2/2003 | Sosniak et al. ................ 257/89 |
| 2003/0042908 A1 | 3/2003 | St-Germain |
| 2003/0042914 A1 | 3/2003 | St-Germain |
| 2003/0067302 A1 | 4/2003 | St-Germain |
| 2003/0067773 A1 | 4/2003 | Marshall et al. |
| 2003/0089918 A1 | 5/2003 | Hiller et al. |
| 2003/0146411 A1 | 8/2003 | Srivastava et al. |
| 2003/0151361 A1 | 8/2003 | Ishizaka |
| 2003/0168670 A1 | 9/2003 | Roberts et al. ................ 257/98 |
| 2003/0208714 A1 | 11/2003 | Taskar et al. |
| 2003/0209714 A1 | 11/2003 | Taskar |
| 2003/0209997 A1 | 11/2003 | St-Germain et al. |
| 2003/0214817 A1 | 11/2003 | Hacker |
| 2003/0222268 A1 | 12/2003 | Tocom et al. |
| 2003/0230751 A1 | 12/2003 | Harada |
| 2004/0028097 A1 | 2/2004 | Miybe et al. .................. 372/36 |
| 2004/0036079 A1 | 2/2004 | Nakada et al. |
| 2004/0046178 A1 | 3/2004 | Sano |
| 2004/0070000 A1 | 4/2004 | Ng et al. |
| 2004/0104391 A1 | 6/2004 | Maeda et al. |
| 2004/0105261 A1 | 6/2004 | Ducharme et al. |
| 2004/0105264 A1 | 6/2004 | Spero |
| 2004/0119083 A1 | 6/2004 | Su et al. ........................ 257/98 |
| 2004/0140765 A1 | 7/2004 | Takekuma |
| 2004/0144987 A1 | 7/2004 | Ouderkirk et al. ............ 257/98 |
| 2004/0150997 A1 | 8/2004 | Ouderkirk et al. |
| 2004/0021299 A1 | 10/2004 | Mohacsi |
| 2004/0212998 A1 | 10/2004 | Mohacsi |
| 2004/0217362 A1 | 11/2004 | Slater et al. |
| 2004/0217364 A1 | 11/2004 | Tarsa et al. |
| 2004/0218387 A1 | 11/2004 | Gerlach |
| 2004/0218390 A1 | 11/2004 | Holman et al. |
| 2004/0222435 A1 | 11/2004 | Shimizu et al. .............. 257/100 |
| 2004/0222735 A1 | 11/2004 | Ragle |
| 2004/0239243 A1 | 12/2004 | Roberts et al. ............... 313/512 |
| 2004/0245543 A1 | 12/2004 | Yoo ............................. 257/103 |
| 2004/0252962 A1 | 12/2004 | Ryan |
| 2004/0264193 A1 | 12/2004 | Okumura |
| 2005/0002191 A1 | 1/2005 | Shimizu et al. |
| 2005/0003565 A1 | 1/2005 | Eisen et al. |
| 2005/0030744 A1 | 2/2005 | Ducharme et al. |
| 2005/0052378 A1 | 3/2005 | Hacker |
| 2005/0082562 A1 | 4/2005 | Ou et al. ....................... 257/103 |
| 2005/0082974 A1 | 4/2005 | Fukawawa et al. |
| 2005/0093008 A1 | 5/2005 | Suehiro et al. |
| 2005/0117334 A1 | 6/2005 | Lee et al. |
| 2005/0121688 A1 | 6/2005 | Nagai et al. |
| 2005/0127381 A1 | 6/2005 | Vitta et al. |
| 2005/0179042 A1 | 8/2005 | Yang et al. |
| 2005/0184298 A1 | 8/2005 | Ueda ............................. 257/79 |
| 2005/0184638 A1 | 8/2005 | Mueller et al. |
| 2005/0205974 A1 | 9/2005 | Su et al. ....................... 257/678 |
| 2005/0221519 A1 | 10/2005 | Leung et al. .................. 438/27 |
| 2005/0227569 A1 | 10/2005 | Maeda et al. |
| 2005/0231948 A1 | 10/2005 | Pohlert et al. |
| 2005/0242364 A1 | 11/2005 | Moustakas et al. .......... 257/103 |
| 2005/0243556 A1 | 11/2005 | Lynch |
| 2005/0248271 A1 | 11/2005 | Ng et al. |
| 2005/0251698 A1 | 11/2005 | Lynch et al. |
| 2005/0253151 A1 | 11/2005 | Sakai et al. |
| 2005/0253158 A1 | 11/2005 | Yasukawa et al. ............ 257/98 |
| 2005/0259423 A1 | 11/2005 | Heuser et al. |
| 2005/0274972 A1 | 12/2005 | Roth et al. |
| 2005/0285130 A1 | 12/2005 | Hsieh ............................ 257/98 |
| 2006/0002101 A1 | 1/2006 | Wheatley et al. |
| 2006/0006404 A1 | 1/2006 | Ibbetson |
| 2006/0011935 A1 | 1/2006 | Krames et al. ................ 257/99 |
| 2006/0012989 A1 | 1/2006 | Lee |
| 2006/0022582 A1 | 2/2006 | Radkov |
| 2006/0040416 A1 | 2/2006 | Sano |
| 2006/0060872 A1 | 3/2006 | Edmond et al. |
| 2006/0060877 A1 | 3/2006 | Edmond et al. |
| 2006/0060888 A1 | 3/2006 | Kim et al. .................... 257/200 |
| 2006/0067073 A1 | 3/2006 | Ting |
| 2006/0071589 A1 | 4/2006 | Radkov |
| 2006/0081869 A1 | 4/2006 | Lu et al. ........................ 257/99 |
| 2006/0105482 A1 | 5/2006 | Alferink et al. |
| 2006/0105485 A1 | 5/2006 | Basin et al. .................... 438/27 |
| 2006/0113548 A1 | 6/2006 | Chen et al. |
| 2006/0120517 A1 | 6/2006 | Pickard et al. |
| 2006/0131599 A1 | 6/2006 | Slater, Jr. et al. |
| 2006/0138435 A1 | 6/2006 | Tarsa et al. |
| 2006/0138937 A1 | 6/2006 | Ibbetson |
| 2006/0145170 A1 | 7/2006 | Cho |
| 2006/0154392 A1 | 7/2006 | Tran et al. |
| 2006/0170083 A1* | 8/2006 | Kim ......................... H01L 33/62 |
| | | 257/666 |
| 2006/0180818 A1 | 8/2006 | Nagai et al. |
| 2006/0181192 A1 | 8/2006 | Radkov et al. |
| 2006/0245184 A1 | 11/2006 | Galli |
| 2006/0255341 A1 | 11/2006 | Pinnington et al. ........... 257/79 |
| 2006/0284207 A1 | 12/2006 | Park et al. ...................... 257/99 |

(56) References Cited

U.S. PATENT DOCUMENTS

| | | |
|---|---|---|
| 2007/0001188 A1 | 1/2007 | Lee |
| 2007/0041220 A1 | 2/2007 | Lynch |
| 2007/0051966 A1 | 3/2007 | Higashi et al. |
| 2007/0080337 A1* | 4/2007 | Sorg ............... H01L 33/62 257/13 |
| 2007/0090381 A1 | 4/2007 | Otsuka et al. |
| 2007/0137374 A1 | 6/2007 | Van de Ven et al. |
| 2007/0139920 A1 | 6/2007 | Van de Ven et al. |
| 2007/0139923 A1 | 6/2007 | Negley |
| 2007/0170447 A1 | 7/2007 | Negley |
| 2007/0171145 A1 | 7/2007 | Coleman et al. |
| 2007/0202623 A1 | 8/2007 | Gao et al. |
| 2007/0215890 A1 | 9/2007 | Harbers et al. |
| 2007/0223219 A1 | 9/2007 | Medendorp et al. |
| 2007/0236911 A1 | 10/2007 | Negley |
| 2007/0247414 A1 | 10/2007 | Roberts |
| 2007/0247841 A1* | 10/2007 | Kono ............... H01L 33/486 362/227 |
| 2007/0247847 A1 | 11/2007 | Villard |
| 2007/0262337 A1 | 11/2007 | Villard |
| 2007/0262338 A1 | 11/2007 | Higashi et al. ............ 257/99 |
| 2007/0262339 A1* | 11/2007 | Hussell ............ C09K 11/7731 257/99 |
| 2007/0263393 A1 | 11/2007 | Van de Ven et al. |
| 2007/0267983 A1 | 11/2007 | Van de Ven et al. |
| 2007/0274080 A1 | 11/2007 | Negley |
| 2007/0276606 A1 | 11/2007 | Radkov et al. |
| 2007/0284063 A1 | 11/2007 | Negley |
| 2007/0278503 A1 | 12/2007 | Van de Ven et al. |
| 2007/0278934 A1 | 12/2007 | Van de Ven et al. |
| 2007/0278974 A1 | 12/2007 | Van de Ven et al. |
| 2007/0279440 A1 | 12/2007 | Van de Ven et al. |
| 2007/0279903 A1 | 12/2007 | Negley |
| 2007/0280624 A1 | 12/2007 | Negley et al. |
| 2008/0042151 A1 | 2/2008 | Oh et al. ............... 257/88 |
| 2008/0048200 A1 | 2/2008 | Mueller et al. |
| 2008/0084685 A1 | 4/2008 | Van de Ven et al. |
| 2008/0084700 A1 | 4/2008 | Negley |
| 2008/0084701 A1 | 4/2008 | Van de Ven et al. |
| 2008/0088248 A1 | 4/2008 | Myers |
| 2008/0089053 A1 | 4/2008 | Negley |
| 2008/0106895 A1 | 5/2008 | Van de Ven et al. |
| 2008/0106907 A1 | 5/2008 | Trott et al. |
| 2008/0112168 A1 | 5/2008 | Pickard et al. |
| 2008/0112170 A1 | 5/2008 | Trott et al. |
| 2008/0112183 A1 | 5/2008 | Negley |
| 2008/0130265 A1 | 6/2008 | Negley |
| 2008/0130285 A1 | 6/2008 | Negley |
| 2008/0136313 A1 | 6/2008 | Negley et al. |
| 2008/0137347 A1 | 6/2008 | Trott et al. |
| 2008/0170396 A1 | 7/2008 | Yuan et al. |
| 2008/0179602 A1 | 7/2008 | Negley |
| 2008/0192462 A1 | 8/2008 | Steedly et al. |
| 2008/0192493 A1 | 8/2008 | Villard |
| 2008/0211416 A1 | 9/2008 | Negley |
| 2008/0230790 A1* | 9/2008 | Seko ............... H01L 33/486 257/89 |
| 2008/0231201 A1 | 9/2008 | Higley et al. |
| 2008/0259589 A1 | 10/2008 | Van de Ven et al. |
| 2008/0278940 A1 | 11/2008 | Van de Ven et al. |
| 2008/0278950 A1 | 11/2008 | Pickard et al. |
| 2008/0278952 A1 | 11/2008 | Trott et al. |
| 2008/0278928 A1 | 12/2008 | Van de Ven et al. |
| 2008/0304260 A1 | 12/2008 | Van de Ven et al. |
| 2008/0304261 A1 | 12/2008 | Van de Ven et al. |
| 2008/0304269 A1 | 12/2008 | Pickard et al. |
| 2008/0309255 A1 | 12/2008 | Myers |
| 2008/0310154 A1 | 12/2008 | Van de Ven et al. |
| 2008/0315228 A1 | 12/2008 | Krames et al. ............ 257/98 |
| 2009/0002986 A1 | 1/2009 | Medendorp et al. |
| 2009/0173958 A1 | 7/2009 | Chakraborty et al. ......... 257/98 |
| 2009/0278148 A1 | 11/2009 | Nabekura et al. ............ 257/98 |
| 2011/0018013 A1 | 1/2011 | Margalith et al. ............ 257/91 |
| 2011/0132521 A1 | 6/2011 | Paolini et al. ............ 156/67 |
| 2011/0175127 A1* | 7/2011 | Kanada ............... H01L 33/60 257/98 |
| 2012/0132937 A1* | 5/2012 | Chan ............... H01L 25/0753 257/89 |
| 2013/0056780 A1* | 3/2013 | Kono ............... H01L 33/60 257/98 |

FOREIGN PATENT DOCUMENTS

| | | | |
|---|---|---|---|
| CN | 1624944 | 6/2005 | |
| CN | 101366126 | 2/2009 | |
| CN | 101405646 | 4/2009 | |
| CN | 101553936 | 10/2009 | |
| CN | 101636851 | 1/2010 | |
| CN | 1492521 | 9/2016 | |
| DE | 39 16 875 | 12/1990 | |
| DE | 42 28 895 | 3/1994 | |
| DE | 10006738 | 9/2001 | |
| DE | 10105802 | 8/2002 | |
| DE | 10253911 | 4/2004 | |
| DE | 103 35 077 | 3/2005 | |
| EP | 0 838 866 | 4/1998 | |
| EP | 0971421 A2 | 1/2000 | |
| EP | 1059678 A2 | 3/2000 | |
| EP | 1024399 | 8/2000 | |
| EP | 1059667 A2 | 12/2000 | |
| EP | 1059678 A2 | 12/2000 | |
| EP | 1081771 | 7/2001 | |
| EP | 1 160 883 | 12/2001 | |
| EP | 1160883 A | 12/2001 | |
| EP | 1168902 A2 | 1/2002 | ............... H05K 5/00 |
| EP | 1246266 A2 | 2/2002 | |
| EP | 1 193 772 A2 | 4/2002 | |
| EP | 1 571 713 A1 | 9/2003 | |
| EP | 1367655 A1 | 12/2003 | |
| EP | 1 462 711 | 9/2004 | |
| EP | 1526057 | 4/2005 | |
| EP | 1566848 | 8/2005 | |
| EP | 1641049 | 3/2006 | |
| EP | 1641049 A1 | 3/2006 | |
| EP | 1 760 795 A2 | 3/2007 | |
| GB | 1376086 | 12/1974 | |
| GB | 2282700 A | 4/1995 | |
| JP | 5371375 | 11/1951 | |
| JP | 508494 | 1/1975 | |
| JP | S 50-8494 | 1/1975 | |
| JP | 5298384 | 7/1977 | |
| JP | S0106175 | 6/1985 | |
| JP | 61032483 | 2/1986 | |
| JP | 6194362 | 6/1986 | |
| JP | S61144890 | 7/1986 | |
| JP | 6214481 | 1/1987 | |
| JP | 62143942 | 9/1987 | |
| JP | 646038 | 1/1989 | |
| JP | 01230274 | 9/1989 | |
| JP | H01139664 | 9/1989 | |
| JP | 01267973 | 11/1989 | |
| JP | 01287973 | 11/1989 | |
| JP | 03035568 | 2/1991 | |
| JP | 03187229 | 8/1991 | |
| JP | 04028269 | 1/1992 | ............... H01L 33/00 |
| JP | 440555 | 4/1992 | |
| JP | 04313281 | 11/1992 | |
| JP | 05327012 | 12/1993 | |
| JP | 06104463 | 4/1994 | |
| JP | H06177427 | 6/1994 | |
| JP | 06275866 | 9/1994 | |
| JP | 07007180 | 1/1995 | |
| JP | 07176794 | 7/1995 | |
| JP | 08007614 | 1/1996 | |
| JP | 08213660 | 8/1996 | |
| JP | 8314395 | 11/1996 | |
| JP | 09083018 | 3/1997 | |
| JP | H09138402 | 5/1997 | |
| JP | 09-153646 | 6/1997 | |
| JP | 09181359 | 7/1997 | |
| JP | 10012929 A | 1/1998 | |
| JP | 10-163535 | 6/1998 | |
| JP | 10190065 | 7/1998 | |

(56) References Cited

FOREIGN PATENT DOCUMENTS

| | | |
|---|---|---|
| JP | H10190065 | 7/1998 |
| JP | 10233532 | 9/1998 |
| JP | 10312990 | 11/1998 |
| JP | 11026808 | 1/1999 |
| JP | H11177129 | 7/1999 |
| JP | 11284234 | 10/1999 |
| JP | 2000022222 | 1/2000 |
| JP | 2000183408 | 6/2000 |
| JP | 2000315826 | 11/2000 |
| JP | 2000-353826 | 12/2000 |
| JP | 2000353826 A | 12/2000 |
| JP | 2001000043 | 1/2001 |
| JP | 20011111114 | 4/2001 |
| JP | 2001177153 | 6/2001 |
| JP | 20011156331 | 6/2001 |
| JP | 2001203396 | 7/2001 |
| JP | 2001217467 | 8/2001 |
| JP | 2003750610 | 11/2001 |
| JP | 2002076443 | 3/2002 |
| JP | 2002100609 | 4/2002 |
| JP | 2002111065 | 4/2002 |
| JP | 2002-150821 | 5/2002 |
| JP | 2002141556 | 5/2002 |
| JP | 2002203989 | 7/2002 |
| JP | 2002520823 | 7/2002 |
| JP | 2002217450 | 8/2002 |
| JP | 2002270515 | 8/2002 |
| JP | 2002261333 | 9/2002 |
| JP | 2002270515 | 9/2002 |
| JP | 2002-299699 | 10/2002 |
| JP | 2002289923 | 10/2002 |
| JP | 2002299699 A | 10/2002 |
| JP | U3091911 | 11/2002 |
| JP | 2002353497 | 12/2002 |
| JP | 2002353516 | 12/2002 |
| JP | 2002368286 | 12/2002 |
| JP | 20022368277 | 12/2002 |
| JP | 2003017756 | 1/2003 |
| JP | 2003023176 | 1/2003 |
| JP | 2003036707 | 2/2003 |
| JP | 2003037297 | 2/2003 |
| JP | 2003046117 | 2/2003 |
| JP | 2003046140 | 2/2003 |
| JP | 2003046141 | 2/2003 |
| JP | 2003110146 | 4/2003 |
| JP | 2003115204 | 4/2003 |
| JP | 2003124524 | 4/2003 |
| JP | 2003-515956 | 5/2003 |
| JP | 2003523635 A | 5/2003 |
| JP | 2003533030 | 5/2003 |
| JP | 2003174191 | 6/2003 |
| JP | 2003209283 | 7/2003 |
| JP | 2003218383 | 7/2003 |
| JP | 2003234509 | 8/2003 |
| JP | 2003234509 A | 8/2003 |
| JP | 2003258296 | 8/2003 |
| JP | 2003-529889 | 10/2003 |
| JP | 2003533030 | 11/2003 |
| JP | 2003347601 | 12/2003 |
| JP | 2004-031856 | 1/2004 |
| JP | 2004031856 | 1/2004 |
| JP | 2004505434 | 2/2004 |
| JP | 2004-080046 | 3/2004 |
| JP | 2004071357 | 3/2004 |
| JP | 2004507095 A | 3/2004 |
| JP | 2004-103443 | 4/2004 |
| JP | 2004119839 | 4/2004 |
| JP | 2004134803 | 4/2004 |
| JP | 2004511080 | 4/2004 |
| JP | 2004152808 | 5/2004 |
| JP | 2004238441 | 8/2004 |
| JP | 2004253309 | 9/2004 |
| JP | 2004266124 | 9/2004 |
| JP | 2005266124 | 9/2004 |
| JP | 2004-356116 | 12/2004 |
| JP | 2004363055 | 12/2004 |
| JP | 2004363343 | 12/2004 |
| JP | 2004363537 | 12/2004 |
| JP | 20055433 | 1/2005 |
| JP | 2005005482 | 1/2005 |
| JP | 2005026276 | 1/2005 |
| JP | 2005045199 | 2/2005 |
| JP | 2005050838 | 2/2005 |
| JP | 2005077089 | 3/2005 |
| JP | 2005101296 | 4/2005 |
| JP | 2005109212 | 4/2005 |
| JP | 20055191192 | 4/2005 |
| JP | 2005123238 | 5/2005 |
| JP | 2005-142311 | 6/2005 |
| JP | 2005-158971 | 6/2005 |
| JP | 2005158971 | 6/2005 |
| JP | 2005166937 | 6/2005 |
| JP | 2005166941 | 6/2005 |
| JP | 2005167079 | 6/2005 |
| JP | 2005175389 | 6/2005 |
| JP | 2005-191514 | 7/2005 |
| JP | 2005191414 | 7/2005 |
| JP | 2005191514 | 7/2005 |
| JP | 2005209852 | 8/2005 |
| JP | 2005244152 | 9/2005 |
| JP | 2005294736 A | 10/2005 |
| JP | 2005303012 | 10/2005 |
| JP | 2005303211 | 10/2005 |
| JP | 2005303211 A | 10/2005 |
| JP | 2005340750 | 12/2005 |
| JP | 2005353816 | 12/2005 |
| JP | 2006-049799 | 2/2006 |
| JP | 2006036930 | 2/2006 |
| JP | 2006086254 | 3/2006 |
| JP | 2006114909 | 4/2006 |
| JP | 2006191103 | 7/2006 |
| JP | 2006216717 | 8/2006 |
| JP | 2006229109 | 8/2006 |
| JP | 2006278675 | 10/2006 |
| JP | 2006339362 | 12/2006 |
| JP | 2006352061 | 12/2006 |
| JP | 2007-019560 | 1/2007 |
| JP | 2007005091 | 1/2007 |
| JP | 2007019560 | 1/2007 |
| JP | 2007080885 | 3/2007 |
| JP | 2007110053 | 4/2007 |
| JP | 2007122950 | 5/2007 |
| JP | 2007141737 | 6/2007 |
| JP | 2007150331 | 6/2007 |
| JP | 2007180430 | 7/2007 |
| JP | 2007227679 | 9/2007 |
| JP | 2007273763 | 10/2007 |
| JP | 2007300106 | 11/2007 |
| JP | 2007300106 A | 11/2007 |
| JP | 2008144030 A | 5/2008 |
| JP | 2008514028 | 5/2008 |
| JP | 2008514028 A | 5/2008 |
| JP | 2008514030 A | 5/2008 |
| JP | 2008300562 | 12/2008 |
| JP | 2009527913 | 7/2009 |
| JP | 2008514030 A5 | 1/2012 |
| KR | 20040087950 | 10/2004 |
| TW | 400438 | 8/2000 |
| TW | 506145 | 10/2002 |
| TW | 511782 | 11/2002 |
| TW | 524391 | 3/2003 |
| TW | 536842 | 6/2003 |
| TW | 546854 | 8/2003 |
| TW | 546859 | 8/2003 |
| TW | M277882 U | 10/2005 |
| WO | 9843014 | 10/1998 |
| WO | WO0019546 | 4/2000 |
| WO | 0034709 | 6/2000 |
| WO | WO 2001/041225 A2 | 6/2001 |
| WO | WO0169692 A | 9/2001 |
| WO | WO02061847 | 8/2002 |
| WO | 2005/004202 A2 | 1/2003 |
| WO | WO03010832 | 2/2003 |
| WO | WO 2003/065464 A1 | 8/2003 |

(56) References Cited

FOREIGN PATENT DOCUMENTS

| WO | WO003065464 | 8/2003 |
| WO | WO003065464 A1 | 8/2003 |
| WO | 2004068909 | 8/2004 |
| WO | 2004100611 | 11/2004 |
| WO | WO2004/100279 | 11/2004 |
| WO | 2005/013365 | 2/2005 |
| WO | WO2005031882 | 4/2005 |
| WO | WO2005112137 | 11/2005 |
| WO | WO2005112137 A1 | 11/2005 |
| WO | WO 2005/124877 | 12/2005 |
| WO | WO2006006556 A1 | 1/2006 |
| WO | 2006/028312 | 3/2006 |
| WO | WO2006028312 A1 | 3/2006 |
| WO | WO2006036565 | 4/2006 |
| WO | WO2006036565 A2 | 4/2006 |
| WO | WO2006036582 | 4/2006 |
| WO | WO2006036582 A1 | 4/2006 |
| WO | 2006/061728 A2 | 6/2006 |
| WO | WO 2006/099741 A1 | 9/2006 |
| WO | WO2006099741 | 9/2006 |
| WO | 2007061758 | 5/2007 |
| WO | WO 2007/063460 A1 | 6/2007 |

OTHER PUBLICATIONS

Solvay, Amodel A-1145 HS polyphthalamide Technical Data Sheet from Advanced Polymers, LLC. Alpharetta, GA.
Kuraray, New Releases 2006, "Heat-Resistant Polymide Resin GENSTAR Manufacturing Structure Enhancement", (Genestar from Kuraray Co., Ltd. Tokyo Japan).
Cree LED Chips from cree.com/products/index.htm (Apr. 2006).
Office Action dated Dec. 22, 2008 from U.S. Appl. No. 11/347,645.
Response from U.S. Appl. No. 11/347.645, filed Mar. 23, 2009.
Office Action dated Jul. 25, 2008 from U.S. Appl. No. 11/347,645.
Response from U.S. Appl. No. 11/347.645, filed Aug. 22, 2008.
Office Action dated Jun. 24, 2009 from U.S. Appl. No. 11/347,645.
Response from U.S. Appl. No. 11/347,645, filed Nov. 24, 2009.
Office Action dated Jun. 4, 2008 from U.S. Appl. No. 11/032,363.
Notice of Allowance from U.S. Appl. No. 11/347,645, dated May 3, 2010.
Compound Semiconductors Online. "LED Lighting Fixtures Inc. Sets Wrold Record at 80 Lumens per Watt for Warm White Fixture", "Compound Semiconductors Online", May 30, 2006, p. 1.
CSA International. "Test Data Report No. 1786317-1", Apr. 20, 2006, p. 1-15. Publisher: CSA International.
US Department of Energy. "Product Test Reference: CALiPer 7-31 Downlight Lamp", "Does SL CALiPer Report". Sep. 2007 p. 1-21.
LED Lighting Fixtures. "LED Lighting Fixtures Creates 750 Lumen Recessed Light and Uses Only 16 Watts of Power", "Press Release from LED Lighting fixtures dated Jan. 26, 2006", Jan. 26, 2006 pp. 1.
U.S. Appl. No. 12/017,676, filed Jan. 22, 2008, Negley, et al.
U.S. Appl. No. 12/146,018, filed Jun. 25, 2008, Roberts, et al.
LED Lighting Fixtures, "LED Lighting Fixtures Inc. achieves unprecedented gain in light output from new luminaire". Press Release from LED Lighting Fixtures dated Apr. 24, 2006, Apr. 24, 2006, pp. 1.
LED Lighting Fixtures, "LED Lighting Fixtures, Inc. Announces Record Performance", Press Release from LED Lighting Fixtures dated Feb. 16, 1006, Jan. 16, 2006, p. 1.
LED Lighting Fixtures, "LED Lighting Fixtures Announces its First LED-based Recessed Down Light". Press Release from LED Lighting Fixtures dated Feb. 7, 2007, pp. 1.
LED Lighting Fixtures. "LED Lighting Fixtures Inc. Sets World Record at 80 Lumens per Watt for Warm White Fixture", Press Release from LED Lighting Fixtures dated May 30, 2006, pp. 1.
Narendran, N. et al., Solid State Lighting: Failure Analysis of White LEDs (astract only), Jun. 11, 2004, p. 1-2.
U.S. Appl. No. 61/022,886, filed Jan. 23, 2008, Myers et al.
U.S. Appl. No. 61/037,365, filed Mar. 18, 2008, Van de Ven et al.
U.S. Appl. No. 61/039,926, filed Mar. 27, 2008, Myers, et al.
U.S. Appl. No. 61/041,404, filed Apr. 1, 2008, Negley et al.
U.S. Appl. No. 12/328,144, filed Dec. 4, 2008, Myers, et al.
U.S. Appl. No. 60/978,880, filed Oct. 10, 2007, Van de Ven, et al.
U.S. Appl. No. 60/990,435, filed Nov. 27, 2007, Van de Ven, et al.
U.S. Appl. No. 60/990,439, filed Nov. 27, 2007, Negley, et al.
U.S. Appl. No. 60/990,724, filed Nov. 28, 2007, Negley, et al.
U.S. Appl. No. 12/419,896, filed Apr. 7, 2009, Brandes, et al.
OptoLED Lighting inc., "OptoLED Product Information", 2009, Publisher: OptoLED GmBH website; accessed at http://www.optoled.de/englisch/products/led.html.
Permlight Inc., "Enbryten LED Prodict Information", Feb. 2005, Publisher: Permlight Inc. website: accessed at http://www.webachive.org displaying that www.permlight.com/products/LEDfixtures.asp was publicly available Jan. 2004.
Web page, Product overview sheets for "Lexel" available from http://web.archive.org/web/20070106231922/http://tirsys.com/technology/index.htm as retrieved Jan. 6, 2007.
Light Emitting Diodes (LEDs) for General Illumination OIDA, edited by Tsao, J.Y. Sandia National Laboratories, Oct. 2002 available at http://lighting.sandia.gov/lightingdocs/OIDA_SSL_LED_Roadmap_Full.pdf as retrieved on Jun. 10, 2004.
Narukawa, Yukio; Narita, Junya: Sakamoto, Takahiko; Deguchi, Kouichiro;Yamada, Takao; and Mukei Takashi. "Ultra-High Efficiency White Light Emitting Diodes", Japanese Journal of Applied Physics, vol. 45, No. 41, 2006, pp. L1084-L1086.
Zukausakas, A., Shuir M.S., Gaska, R., Introduction to Solid-State Lighting:, John Wiley & Sons, 2002, (Section 6.1 pp. 118-122).
Duggal. A. "Organic Electroluminescence" edited by Zakya Kafafi, , CRC Press, 2005. p. 437-466.
Schubert. E.F. "Light-Emitting Diodes" $2^{nd}$ ed. Cambridge University Press, 2006 Chapter 21, pp. 346-366.
European Search Report from Application 06847851.0 dated Mar. 27, 2009.
Nichia Corporation White LED Part Nos. NSPW300BS and NSPW312BS, Date: Nov. 12, 1999, "High Brightness LEDs".
Office Action from U.S. Appl. No. 10/427,274, dated Jan. 7, 2004.
Response to Office Action U.S. Appl. No. 10/427,274, filed May 6, 2004.
Office Action from U.S. Appl. No. 10/427,274, dated Aug. 25, 2004.
Response to Office Action U.S. Appl. No. 10/427,274, filed Nov. 29, 2004.
Office Action from U.S. Appl. No. 10/427,274, dated Feb. 28, 2005.
Response to Office Action U.S. Appl. No. 10/427,274, filed Jun. 28, 2005.
Notice of Allowance U.S. Appl. No. 10/427,274, dated Sep. 23, 2005.
U.S. Appl. No. 12/257,804, filed Oct. 24, 2008.
Krames, "Lumileds Lighting, Light from Silicon valley" Progress and Future Direction of LED Technology, SSL Workshop, Nov. 13, 2003, pp. 1-21.
DOE SSL CALiPer Report. Product Test Reference: CALiPER 07-31 Downlight Lamp.
DOES SL CALiPer Report, Product Test Reference: CALiPER 07-47.
U.S. Department of Energy, "DOE Solid-State Lighting CALiPER Program, Summary of Results: Round 3 of Product Testing" Oct. 2007.
US Department of Energy, DOE Solid-State Lighting CALiPER Program, Summary of Results: Round 4 of Product Testing, Jan. 2008.
US Department of Energy, DOE Solid-State Lighting CALiPER Program. Summary of Results: Round 5 of Product Testing May 2008.
Shimizu, Yoshinori, "Development of High Efficiency LED Downlight", Proceeding of the First International Conference on White LEDs and Solis State Lighting, Nov. 26, 2007, pp. 1-5.
U.S. Appl. No. 11/939,059, filed Nov. 13, 2007.
U.S. Appl. No. 12/057,748, filed Mar. 28, 2008.
U.S. Appl. No. 11/743,324, filed May 2, 2007.
U.S. Appl. No. 11/032,363, filed Jan. 10, 2005.
U.S. Appl. No. 61/075,513, filed Jun. 25, 2008.

(56) References Cited

OTHER PUBLICATIONS

Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.
Cree® XLamp® 7090 XR-E Series LED Binning and Labeling.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/755,162, filed May 30, 2007.
U.S. Appl. No. 11/856,421, filed Sep. 17, 2007.
U.S. Appl. No. 11/854,744, filed Sep. 13, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/870,679, filed Oct. 11, 2007.
U.S. Appl. No. 11/613,714, filed Dec. 20, 2006.
U.S. Appl. No. 11/736,761, filed Apr. 18, 2007.
U.S. Appl. No. 11/736,799, filed Apr. 18, 2007.
U.S. Appl. No. 11/737,321, filed Apr. 19, 2007.
U.S. Appl. No. 12/248,220, filed Oct. 9, 2008.
U.S. Appl. No. 12/277,745, filed Nov. 25, 2008.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 11/948,021, filed Nov. 30, 2007.
U.S. Appl. No. 11/947,323, filed Nov. 29, 2007.
U.S. Appl. No. 12/035,604, filed Feb. 22, 2008.
U.S. Appl. No. 12/117,148, filed May 8, 2008.
U.S. Appl. No. 12/117,271, filed May 8, 2008.
Chhajed et al., *Influence of junction temperature on chromaticity and color-rendering properties of trichromatic white-light sources bared on light-emitting diodes*, Journal of Applied Physics 87, 054506 (2005), pp. 1-8.
Color Kinetics Incorporated, *Color Quality of Intelligent Solid-State Lighting Systems*, Color Quality of Solid-State Light Sources, pp. 1-3, Mar. 2005.
Narendran et al., *Color Rendering Properties of LED Light Sources*, Lighting Research Center, Rensselaer Polytechnic Institute, pp. 1-8, 2002.
Color Kinetics Support : White Papers & Presentations, *Solid State Lighting White Papers & Presentations*, http://www.colorkinetics.com/support/whitepapers/, pp. 1-4, Feb. 22, 2006.
Response to Office Action from U.S. Appl. No. 12/002,429, filed Dec. 21, 2011.
Response to Office Action from U.S. Appl. No. 11/708,990, filed Feb. 15, 2012.
Office Action from U.S. Appl. No. 10/836,743, dated Jan. 26, 2012.
Office Action from U.S. Appl. No. 12/002,429, dated Feb. 1, 2012.
Office Action from U.S. Appl. No. 12/771,938, dated Feb. 1, 2012.
Office Action from U.S. Appl. No. 12/821,069, dated Dec. 28, 2010.
Office Action from U.S. Appl. No. 12/002,429, dated Jan. 28, 2011.
U.S. Patent Application Publication No. US 2003/0124752, Wei et al., Jul. 2003.
Office Action from U.S. Appl. No. 12/002,429, dated Sep. 12, 2011.
Office Action from U.S. Appl. No. 12/384,277, dated Oct. 11, 2011.
Office Action from U.S. Appl. No. 11/708,990, dated Nov. 15, 2011.
Office Action from U.S. Appl. No. 11/523,381, dated Dec. 2, 2011.
Office Action from U.S. Appl. No. 11/708,990, dated Jul. 11, 2013.
Office Action from U.S. Appl. No. 12/002,429, dated Aug. 9, 2013.
Office Action from U.S. Appl. No. 10/786,755, dated Jun. 12, 2013.
Response to OA from U.S. Appl. No. 10/786,755, filed Sep. 10, 2013.
Office Action from U.S. Appl. No. 10/836,743, dated Aug. 22, 2013.
Office Action from U.S. Appl. No. 11/523,361, dated Sep. 17, 2013.
Office Action from U.S. Appl. No. 11/738,665, dated Nov. 8, 2013.
Office Action from U.S. Appl. No. 12/845,629, dated Sep. 24, 2013.
Office Action from U.S. Appl. No. 10/836,743, dated Nov. 19, 2013.
Office Action from U.S. Appl. No. 12/845,629, dated Feb. 11, 2014.
Office Action from U.S. Appl. No. 11/708,990, dated Feb. 12, 2014.
Office Action from U.S. Appl. No. 12/002,249, dated Feb. 26, 2014.
Office Action from U.S. Appl. No. 13/347,243, dated Aug. 15, 2012.
Office Action from U.S. Appl. No. 12/635,818, dated Mar. 14, 2011.
Response to OA from U.S. Appl. No. 13/347,243, filed Sep. 27, 2012.
Response to OA from U.S. Appl. No. 12/635,818, filed Jun. 16, 2011.
Office Action from U.S. Appl. No. 12/635,818, dated Jul. 15, 2011.
Office Action from U.S. Appl. No. 12/635,818, dated Nov. 17, 2011.
Response to OA from U.S. Appl. No. 12/635,818, filed Sep. 26, 2011.
Response to OA from U.S. Appl. No. 12/635,818, filed Feb. 16, 2012.
Office Action from U.S. Appl. No. 13/347,243, dated Apr. 25, 2012.
Office Action from U.S. Appl. No. 12/384,277, dated Jun. 27, 2012.
Office Action from U.S. Appl. No. 10/836,743, dated Jul. 11, 2012.
Office Action from U.S. Appl. No. 11/523,381, dated Oct. 3, 2012.
Office Action from U.S. Appl. No. 12/384,277, dated Nov. 27, 2012.
Office Action from U.S. Appl. No. 12/845,629, dated Feb. 26, 2013.
Office Action from U.S. Appl. No. 10/836,743, dated Feb. 25, 2013.
Response to OA from U.S. Appl. No. 13/347,243, dated Jul. 20, 2012.
Response to OA from U.S. Appl. No. 12/384,277, dated Sep. 27, 2012.
Response to OA from U.S. Appl. No. 10/636,743, dated Sep. 11, 2012.
Response to OA from U.S. Appl. No. 11/523,381, dated Dec. 21, 2012.
Response to OA from U.S. Appl. No. 12/384,277, dated Jan. 28, 2013.
Response to OA from U.S. Appl. No. 12/845,629, dated Apr. 18, 2013.
Response to OA from U.S. Appl. No. 10/836,743, dated May 17, 2013.
Office Action from U.S. Appl. No. 12/384,277, dated Mar. 26, 2013.
Response to OA from U.S. Appl. No. 12/384,277, filed Jun. 26, 2013.
Office Action from U.S. Appl. No. 11/523,381, dated Apr. 5, 2013.
Response to OA from U.S. Appl. No. 11/523,381, filed Jun. 5, 2013.
Office Action from U.S. Appl. No. 13/046,982, dated Dec. 12, 2012.
Response to OA from U.S. Appl. No. 13/046,982, filed Mar. 1, 2013.
Office Action from U.S. Appl. No. 13/046,982, filed Aug. 1, 2012.
Response to OA from U.S. Appl. No. 13/046,982, filed Sep. 21, 2012.
Office Action from U.S. Appl. No. 13/046,982, filed Dec. 7, 2011.
Response to OA from U.S. Appl. No. 13/046,982, filed Sep. 20, 2012.
Office Action from U.S. Appl. No. 13/046,962, filed Jul. 19, 2011.
Response to OA from U.S. Appl. No. 13/046,982, filed Oct. 17, 2011.
Office Action from U.S. Appl. No. 12/845,629, dated Jun. 12, 2013.
Office Action from U.S. Appl. No. 11/523,381, dated Sep. 30, 2010.
Response to Office Action from U.S. Appl. No. 11/523,381, filed Nov. 24, 2010.
Office Action from U.S. Appl. No. 11/523,381, dated Mar. 21, 2011.
Response to Office Action from U.S. Appl. No. 11/523,381, filed Jun. 20, 2011.
Office Action from U.S. Appl. No. 10/836,743, dated Jun. 15, 2011.
Office Action from U.S. Appl. No. 12/384,277, dated Apr. 28, 2011.
Notice of Allowance from U.S. Appl. No. 12/821,069, dated Jun. 15, 2011.
Office Action from U.S. Appl. No. 12/645,629, dated Apr. 6, 2011.
Office Action from U.S. Appl. No. 12/002,429, dated Jun. 9, 2010.
Response to Office Action from U.S. Appl. No. 12/002,429, filed Dec. 1, 2010.
Office Action from U.S. Appl. No. 10/836,743, dated Feb. 14, 2011.

(56) References Cited

OTHER PUBLICATIONS

Response to Office Action from U.S. Appl. No. 10/836,743, filed Apr. 27, 2011.
Office Action from U.S. Appl. No. 11/708,990, dated Feb. 16, 2011.
Response to Office Action from U.S. Appl. No. 12/384,277, filed Sep. 2, 2010.
Office Action from U.S. Appl. No. 11/708,990, dated May 26, 2010.
Response to Office Action from U.S. Appl. No. 11/708,990, filed Nov. 18, 2010.
Office Action from U.S. Appl. No. 11/985,410, dated Jul. 15, 2010.
Response to Office Action from U.S. Appl. No. 11/985,410, filed Dec. 14, 2010.
Office Action from U.S. Appl. No. 10/836,743, dated Dec. 8, 2009.
Response to Office Action from U.S. Appl. No. 10/836,743, filed Apr. 8, 2010.
Response to Office Action from U.S. Appl. No. 12/821,069, filed Apr. 25, 2011.
Office Action from U.S. Appl. No. 11/985,410, dated Jan. 4, 2010.
Response to Office Action from U.S. Appl. No. 11/985,410, filed May 11, 2010.
Office Action from U.S. Appl. No. 10/836,743, dated Apr. 29, 2010.
Response to Office Action from U.S. Appl. No. 10/836,743, filed Aug. 30, 2010.
Office Action from U.S. Appl. No. 12/384,277, dated May 13, 2010.
Summary of Notice of Reasons for Rejection for Japanese Patent Application No. 2007-520314 dated May 10, 2011.
Office Action for Japanese Patent Application No. JP 2006-513442 dated May 12, 2011.
International Search Report and Written Opinion for PCT Application No. PCT/US2011/000381 dated Jun. 8, 2011.
Office Action of the IPO for Taiwan Patent Application No. TW 093112133 dated Jun. 23, 2011.
Notice of Reasons for Rejection from Japanese Patent Application No. 2008-037765 dated Mar. 23, 2011.
Extended Search Report for European Patent Application No. EP 08170514.7 dated Aug. 8, 2011.
Office Action in counterpart Taiwan Application No. 093110313 dated Jun. 29, 2010.
Notification of Reason(s) for Rejection for Japanese Patent Application No. 2008-309821 dated Sep. 12, 2011.
Notification of the Second Office Action for CN 200910137491.3 dated Dec. 23, 2011.
Notice of Reasons for Rejection from Japanese Patent Application No. 2006-533962, dated Dec. 26, 2011.
Notification of Second Office Action from Chinese Patent Application No. 200780014958.4, dated Dec. 21, 2011.
Decision of Rejection from Japanese Patent Application No. 2009-507696, dated Dec. 26, 2011.
Communication pursuant to Article 94(3) EPC from Patent Application No. 04 788 908.4-1224, dated Jan. 27, 2012.
Notice of Reasons for Rejection for Japanese Patent Application No. 2006-533962, dated May 22, 2012.
Joseph S. Shor, et al., "Direct observation of porous SiC formed by anodization in HF". Appl. Phys. Lett. 62 (22), May 31, 1993.
Summary of Final Notice of Reasons for Rejection from Japanese Patent Application No. 2007-520314, dated May 8, 2012.
Examination Report from European Application No. 04 788 908.4-1224, dated Jun. 8, 2012.
Decision of Final Rejection from Japanese Patent Application No. 2008-309821, dated Jun. 14, 2012.
First Office Action from Chinese Patent Appl. No. 200810186835.5, dated Jul. 3, 2012.
Office Action from Taiwanese Patent Application No. 093112133, dated Jul. 27, 2012, received Sep. 5, 2012.
Interrogation from Japanese Patent Application No. 2009-507696, dated Aug. 21, 2012.
Decision of Rejection from Japanese Patent Application No. 2008-037765 dated Sep. 4, 2012.
Decision of Rejection from Japanese Patent Application No. 2006-513442, dated Aug. 23, 2012.
Search Report for Chinese Application No. 200910137491.3, dated Sep. 14, 2012.
Third Office Action for Chinese Application No. 200910137491.3, dated Sep. 24, 2012.
Notice of Reasons for Rejection from Japanese Patent Application No. 2009-507696, dated Feb. 5, 2013.
Inquiry from an Appeal Board from Japanese Patent Appl. No. 2006-513442, dated Mar. 13, 2013.
Second Office Action from Chinese Patent Application No. 200810186835.5, dated Feb. 25, 2013.
Official Action from European Patent Appl. No. 05 761 972.8-1508, dated Mar. 5, 2013.
Interrogation from Japanese Patent Application No. 2008-37765, dated Mar. 19, 2013.
Notification of Reasons for Rejection from Japanese Patent Application No. 2011-248746, dated Jan. 31, 2013.
Office Action from Japanese Patent Application No. 2011-229090, dated Apr. 16, 2013.
Decision of Rejection from Japanese Patent Application No. 2007-520314, dated Apr. 23, 2013.
Decision of Dismissal of Amendment from Japanese Patent Application. No. 2007-520314, dated Apr. 23, 2013.
Decision of Rejection from Japanese Patent Application No. 2006-533962 dated Apr. 23, 2013.
Kasugai, et al, "Moth-Eye Light Emitting Diodes". Mater. Res. Soc. Symp. Proc. vol. 831 © 2005 Materials Research Society.
Decision of Rejection from Chinese Patent Appl. No. 2009-10137491.3, dated Apr. 15, 2013.
Office Action from Korean Patent Appl. No. 10-2008-7017800, dated Mar. 5, 2013.
Office Action from Japanese Patent Appl. No. 2008-547566, dated Nov. 28, 2012 (Brown).
Office Action from U.S. Appl. No. 13/660,131, dated May 30, 2013.
Official Action from European Patent Appl. No. 05761972.8, dated Mar. 8, 2013.
Office Action and Search Report from Taiwanese Patent Appl. No. 094121086, dated May 15, 2013.
Streubel, et al., "High Brightness AlGaInP Light-Emitting Diodes", IEEE Journal of Selected Topics in Quantum Electronics, vol. 8, No. 2, pp. 324-325, Mar./Apr. 2002.
Decision of Rejection from Japanese Patent appl. No. 2010-254633, dated Jun. 4, 2013.
U.S. Appl. No. 60/745,478, filed Apr. 24, 2006.
LABSPHERE Technical Guide, "The Radiometry of Light Emitting Diodes," accessed Jan. 23, 2008 at: http://www.labsphere.com/tecdocs.aspx; 18 pages.
Decision of Rejection from Japanese Patent Appl. No, 2013-509039, dated Oct. 7, 2014.
Office Action and Search Report from Taiwanese Appl. No. 101138314, dated Aug. 5, 2014.
Office Action from Taiwanese Appl. No. 093112133, dated Jul. 25, 2014.
Notification to Grant from Chinese Patent Appl. No. 200810186835.5, dated Aug. 25, 2014.
Office Action from U.S. Appl. No. 10/786,755, dated Aug. 7, 2014.
Office Action from U.S. Appl. No. 10/836,743, dated Sep. 2, 2014.
Translation from Japanese to English of Kaizu, M. (JP-(H)04-(0)28269), "Mounting Structure for an LED Bare Chip", published Jan. 30, 1992; prepared by the Translations Branch at the U.S. Patent and Trademark Office.
Official Action from Japanese Patent Appl. No. 2011-248746, dated Aug. 4, 2014.
Decision of Dismissal of Amendment from Japanese Patent Appl. No. 2011-229090, dated Jul. 29, 2014.
Second Office Action from Chinese Patent Appl. No. 2011103799648, dated Jul. 11, 2014.
Minutes from European Patent Office No. 10 181 251.9 dated Apr. 22, 2014.
Office Action from Taiwanese Patent Appl. No. 103202911 dated Apr. 1, 2014.
Office Action from Korean Application 10-2006--7017800, dated Feb. 27, 2014 (Myers).

(56) References Cited

OTHER PUBLICATIONS

Interrogation from Japanese Patent Appl. No. 2009-507696, dated: Mar. 11, 2014.
Fourth Office Action from Chinese Patent Appl. No. 2008-10186635.5, dated Mar. 5, 2014.
Notice of Reasons for Rejection from Japanese Patent Appl. No. 2013-509039, dated Mar. 11, 2014.
Decision to Refuse a European Patent Application from European Patent Appl. No. 10 181 251.9-1555, dated Apr. 22, 2014.
Intention to Grant from European Patent Application No. 04788908.4-191, dated Jul. 14, 2014.
Office Action from Chinese Patent Appl. No. 201210252142.8, dated May 23, 2014.
Decision of Rejection from Japanese Patent Appl. No. 2012-274904, dated Jul. 1, 2014.
Summary of the Appeal Decision from Japanese Patent Appl. No. 2008-309821, dated Jun. 28, 2014.
Office Action from U.S. Appl. No. 10/836,743, dated May 28, 2014.
Response to OA from U.S. Appl. No. 10/836,743, filed Jul. 28, 2014.
Office Action from U.S. Appl. No. 12/002,429, dated May 30, 2014.
Response to OA from U.S. Appl. No. 12/002,429, filed Jul. 10, 2014.
Office Action from U.S. Appl. No. 11/523,381, dated Jul. 2, 2014.
Reasons of Rejection from Japanese Patent Appl. No. 2006-533962, dated Jun. 3, 2014.
Decision of Dismissal of Appeal against Final Rejection from Korean Patent Appl. No. 10-2011-7028750, dated Jun. 11, 2014.
Decision of Patent Grant from Japanese Patent Appl. No. 2007-520314, dated Jun. 3, 2014.
Reasons for Rejection from Japanese Patent Appl. No. 2011-150211, dated May 14, 2014.
Decision of Rejection from Japanese Patent Appl. No. 2012-288056, dated Jun. 3, 2014.
Fourth Office Action from Chinese Patent Appl. No, 2008-10186835.5, dated Mar. 5, 2014.
Final Notification of Reasons for Rejection from Japanese Patent Appl. No. 2006-513442, dated Feb. 13, 2014.
Examination from European Patent Appl. No. 07754938.4-1564, dated Mar. 18, 2014.
Reasons of Rejection from Japanese Patent appl. No. 2011-229090, dated Mar. 3, 2014.
Reasons of Rejection from Japanese Patent appl. No. 2012-20751, dated Feb. 13, 2014.
Reasons for Rejection from Japanese Patent Appl. No. 2010-254633, dated Dec. 24, 2013.
Reasons for Rejection from Japanese Patent Appl. No. 2012-274904, dated Jan. 7, 2014.
Re-Examination from Taiwanese Patent Appl. No. 100145116, dated Dec. 19, 2013.
Office Action from Japanese Patent Appl. No. 2007-520314, dated Nov. 12, 2013.
Office Action from Taiwanese Patent Appl. No. 094121086, dated Dec. 10, 2013.
Examination Report from European Patent Appl. No. 04788908.4-1901, dated Jan. 9, 2014.
Interrogation from Japanese Patent Appl. No. 2006-533962, dated Dec. 10, 2013.
First Office Action from Chinese Patent Appl. No. 201110379964.8, dated Nov. 22, 2013.
Notice of Reasons for Rejection from Japanese Patent Appl. No. 2012-288056, dated Dec. 10, 2013.
Office Action from Japanese Patent Appl. No. 2012-232743, dated Nov. 20, 2013.
Office Action from Japanese Patent Appl. No. 2012-232744, dated Nov. 20, 2013.
Reasons for Rejection from Japanese Patent Appl. No. 2006-513442, dated Sep. 9, 2013.
Notification of Reasons for Rejection from Japanese Patent Appl. No. 2008-309821, dated Sep. 19, 2013.
Reasons for Rejection from Japanese Patent Appl. No. 2011-150211, dated Aug. 26, 2013.
Reasons for Rejection from Japanese Patent Appl. No. 2011-229090, dated Aug. 27, 2013.
Reasons for Rejection from Japanese Patent Appl. No. 2009-507696, dated Aug. 22, 2013.
Third Office Action from Chinese Patent Appl. No. 200810186835.5, dated Aug. 22, 2013.
Reasons for Rejection from Japanese Patent Appl. No. 2012-232744, dated Jun. 26, 2013.
Office Action from Japanese Patent appl. No. 2012-232743, dated Jun. 25, 2013.
Decision of Final Rejection from Japanese Patent Appl. No. 2011-248746, dated Jun. 12, 2013.
Notification of Reasons for Rejection from Japanese Patent Appl. No. 2011-150211, dated Jan. 16, 2013.
Appeal Board Decision from Japanese Patent Appl. No. 2008-111759, Appeal No. 2012-2744 dated Dec. 20, 2012.
Office Action from German Patent Application No. 10 2006 020 158.6, dated Dec. 11, 2012.
Decision of Final Rejection from Japanese patent application No. 2008-111759, dated Jan. 16, 2012.
Office Action from counterpart Japanese Patent Application No. 2008-111759 dated Jan. 6, 2011.
Examination from European Patent Appl. No. 05 761 972.8-1504, dated Nov. 9, 2015.
Second Office Action from Chinese Patent Appl. No. 2011800219066, dated Nov. 4, 2015.
Fifth Office Action from Chinese Patent Appl. No, 2009101374913, dated Jan. 6, 2016.
Office Action from Chinese Appl. No. 201210252142.8, dated Dec. 11, 2014.
Summary of Pretrial Report from Japanese Appl. No. 2011-229090, dated Dec. 19, 2014.
Translated Office Action from Taiwanese Appl. No. 099121883, dated Nov. 13, 20144.
First Office Action and Search Report from Chinese Appl. No. 2011800219066, dated Dec. 26, 2014.
Office Action from U.S. Appl. No. 12/002,429, dated Nov. 12, 2014.
Office Action from U.S. Appl. No. 11/738,665, dated Nov. 28, 2014.
Office Action from U.S. Appl. No. 11/523,381, dated Dec. 8, 2014.
Office Action from U.S. Appl. No. 10/786,755, dated Dec. 31, 2014.
Notice of Prelim. Pre-Appeal Examination from Japanese Patent Appl. No. 2012-247904, dated Feb. 10, 2015.
Final Notification of Reasons for Rejection from Japanese Patent Appl. No. 2011-248746, dated Jan. 13, 2015.
Third Office Action from Chinese Patent Appl. No. 2011-103799648, dated Jan. 13, 2015.
Pretrial Report from Japanese Patent Appl. No. 2012-288056, dated Jan. 21, 2015.
Office Action from Japanese Patent Appl No. 2013-16358, dated Mar. 10, 2015.
Notice of Allowance from Taiwanese Patent Appl. No. 101138314, dated Mar. 18, 2015.
Notice of Allowance from Taiwanese Patent Appl. No. 093112133, dated Feb. 17, 2015.
Petition from Japanese Patent Appl. No. 2014-14901, dated Mar. 11, 2015.
Office Action from U.S. Appl. No. 10/836,743, dated Jan. 30, 2015.
Office Action from U.S. Appl. No. 11/708,990, dated Feb. 13, 2015.
Office Action from U.S. Appl. No. 11/523,381, dated Mar. 13, 2015.
Trial Decision and Notice of Allowance from Japanese Patent Appl. No. 2013-16358, dated Apr. 14, 2015.
Official Action from Japanese Patent Appl. No. 2012-232743 dated Apr. 20, 2015.
Official Action from Japanese Patent Appl. No. 2012-232744, dated Apr. 20, 2015.
Preliminary Examination Report from Japanese Patent appl. No. 2012-274904, dated Jan. 26, 2015.
Office Action from Japanese Appl. No. 2011-229090, dated Jun. 2, 2015.
Fourth Office Action from Chinese Patent Appl. No. 2009101374913, dated Apr. 21, 2015.

(56) References Cited

OTHER PUBLICATIONS

Office Action from U.S. Appl. No. 12/002,429, dated May 7, 2015.
Office Action from U.S. Appl. No. 11/738,665, dated May 11, 2015.
Office Action from U.S. Appl. No. 10/836,743, dated May 26, 2015.
Certificate of Patent for Japanese Patent Appl. No. 2006-533962, dated May 22, 2015.
Notice of Issuance from Chinese Patent Appl. No. 201210252142.8, dated Jun. 3, 2015.
Appeal Decision in Japanese Patent Appl. No. 2012-274904, dated Jun. 23, 2015.
Fourth Office Action from Chinese Patent Appl. No. 2011103799648, dated Jul. 14, 2015.
Reasons for Rejection from Japanese Patent Appl. No. 2011-229090, dated Jun. 2, 2015.
Office Action from Japanese Patent Appl. No. 2013-509039, dated Aug. 3, 2015.
Office Action from U.S. Appl. No. 12/002,429, dated Sep. 24, 2015.
Office Action from U.S. Appl. No. 11/523,381, dated Oct. 7, 2015.
Response to OA from U.S. Appl. No. 10/836,743, filed Dec. 2, 2015.
Office Action from U.S. Appl. No. 10/836,743, dated Oct. 8, 2015.
Response to OA from U.S. Appl. No. 10/836,743, filed Dec. 4, 2015.
U.S. Appl. No. 10/911,643, filed Aug. 5, 2004, Kato, et al.
U.S. Appl. No. 11/029,389, filed Jan. 6, 2005, Imai.
Office Action from Japanese Patent Appl. No. 2012-232743, dated Dec. 14, 2015.
Decision of Rejection from Japanese Patent Appl. No. 2011-150211, dated Oct, 14, 2014.
Examination Report from European Patent Appl. No. 08 170 514.7-1564, dated Nov. 12, 2014.
Decision of Re-Examination from Chinese Appl. No. 200910137491.3. dated Nov. 21, 2014.
Examiner's Reconsideration Report from Japanese Appl. No. 2012-232743, dated Nov. 10, 2014.
Examiner's Reconsideration Report from Japanese Appl. No. 2012-232744, dated Nov. 11, 2014.
Notice of Allowance for Application No. 20110-229090; dated Apr. 18, 2016.
Appeal Decision for Application No. 2014-10492; dated May 8, 2016.
Decision of Rejection from Chinese Patent Appl. No. 2011103799648, dated Jan. 21, 2016.
Notice of Allowance from Chinese Patent Appl. No. 201180021906.6, dated Mar. 17, 2016.
Request for Correction from Chinese Patent Appl. No. 2011500219066, dated Feb. 26, 2016.
Notice of Allowance from Japanese Patent Appl. No. 2013-509039, dated Mar. 8, 2016.
Office Action from U.S. Appl. No. 10/836,743; dated Feb. 8, 2016.
Office Action from U.S. Appl. No. 11/523,381; dated Feb. 12, 2016.
Foreign Office Action for Chinese Application No. 200910137491.3; dated Jul. 18, 2016.
Foreign Office Action for European Application No. 04750926.0; dated Jul. 21, 2016.
Office Action for U.S. Appl. No. 10/836,743; dated Aug. 5, 2016.
Notice of Re-Examination for Chinese Application No. 2011103799648; dated Sep. 9, 2016.
Oral Proceedings for European Application No. 8170514.7; Dated Mar. 27, 2017.

* cited by examiner

TINY 6 PIN SIDE VIEW SURFACE MOUNT LED

BACKGROUND OF THE INVENTION

Field of the Invention

The present invention relates to light emitting diodes (LEDs) and in particular relates packaged LEDs that are used in side-view surface mount applications and that produce white light.

Description of the Related Art

The basic physics of light emitting diodes is well understood in the art and explained in sources that include, but are not limited to Sze, *Physics of Semiconductor Devices,* 2d Edition (1981) and Sze, *Modern Semiconductor Device Physics* (1998). The practical applications of light emitting diodes are also well understood and are explained in helpful terms in a number of sources including *LED Lighting Systems,* NLPIP Lighting Answers, Volume 7, Issue 3, May 2003, and Schubert, *Light Emitting Diodes* (Cambridge University Press, 2003).

Side-view surface mount light emitting diodes (also referred to as "side-lookers" or "sidelookers") are LEDs that are packaged in a manner that transmits their radiation beam parallel to the plane of a circuit board or similar mount. In turn, side looker diodes that can produce white light are useful for incorporation into relatively small devices such as the color screen displays of cellular phones, personal digital assistants ("PDA's"), portable gaming devices, and similar applications.

Such applications often use liquid crystal displays ("LCDs"), polarizing materials, and color filters to create full-color effects. Because typical liquid crystals do not produce light, they are most often used in conjunction with a lighting source and other display elements to produce the desired visible output. For a number of reasons (low cost, long lifetime, reliability), light emitting diodes are frequently used as the light source in such displays. In turn, LEDs that produce white light are particularly useful for such purposes.

In physically small or low power display applications such as cell phones, one design places the white LEDs diodes along the edge or perimeter of the other display elements. When the LEDs are placed in this position, they provide output that is substantially parallel to the display rather than perpendicular to it. Accordingly, diodes that are packaged in a manner that directs their output laterally with respect to a defined plane (usually a circuit board or a display element), are referred to as side-view surface mount diodes or "sidelookers."

In general, light emitting diodes produce white light using two different approaches. In one approach, multiple LEDs of complimentary hues (e.g., red, green, and blue) are combined to produce white light. In another approach, a light emitting diode that emits in a higher energy portion of the visible spectrum (i.e., blue, violet, or ultraviolet) is used in conjunction with a phosphor that emits in a lower energy region of the visible spectrum; e.g. yellow when excited by the higher energy photons. When properly selected, the combination of the radiation emitted by the diode, and the yellow radiation emitted by the phosphor, produce white light.

The red-green-blue diode approach can offer the advantage of truer color in some circumstances, but typically requires active feedback and control of each LED hue. Alternatively, the single diode with phosphor approach is somewhat simpler in terms of physical construction and circuitry because it requires only the single (usually blue) LED and one or more phosphors, typically carried by an encapsulant adjacent to the diode chip. Other factors that can reduce the output include the amount and composition of the phosphor, its placement, the composition and geometry of encapsulant, and the geometry of the package.

It is advantageous to improve manufacturing techniques and produce more reliable devices. Additionally, it is important to increase manufacturing ease and mounting efficiency.

SUMMARY OF THE INVENTION

In one aspect the present disclosure includes a light emitting device, comprising a side oriented package comprising a floor. The device further comprises a plurality of light emitting diodes (LEDs) mounted on the floor. Furthermore, the device includes a plurality of contact pins in electrical contact with the plurality of LEDs. The plurality of contact pins protruding from a side of the package wherein the contact pins comprise a mount surface, in which at least one of said contact pins is oriented in a direction opposite the remaining contact pins. The LEDs of the device are disposed to emit light in a direction parallel to said mount surface.

In another aspect, the present disclosure includes a light emitting device, comprising a package comprising a floor. The device also includes a plurality of light emitting diodes (LEDs) mounted on the floor. The device further includes a plurality of contact pins in electrical contact with the plurality of LEDs. The floor comprises a plurality of bond pads to facilitate electrical connection between the LEDs and the plurality of contact pins, in which adjacent bond pads have a tapered shape such that the widest portion of a first bond pad is adjacent to the narrowest portion of a second bond pad.

In yet another aspect, the present disclosure includes a display element comprising the combination of a light emitting diode and a planar display element, the combination comprising a substantially planar display element and a light emitting device positioned on the perimeter of the display element. The light emitting device comprising a side oriented package comprising a floor and a plurality of light emitting diodes (LEDs) mounted on the floor. The device also includes a plurality of contact pins in electrical contact with the plurality of LEDs, the plurality of contact pins protruding from a side of the package wherein the contact pins comprise a mount surface, in which at least one of the contact pins is oriented in a direction opposite the remaining contact pins; wherein the LEDs are disposed to emit light in a direction parallel to the mount surface.

The foregoing and other objects and advantages of the invention and the manner in which the same are accomplished will become clearer based on the following detailed description taken in conjunction with the accompanying drawings.

DETAILED DESCRIPTION

FIGS. 1-4 illustrate exemplary side view surface mount device structures with respect to the current disclosure. In its broadest context, the invention is a light emitting diode that comprises a package support, and at least one semiconductor chip on the package support. In exemplary embodiments, the package support may be reflective (or may include reflective elements) to enhance the light output. A reflective package may be formed of a white resin such as a polyphthalamide (e.g. AMODEL from Solvay Advanced Polymers, L.L.C., Alpharetta, Ga. USA) or a heat-resistant polyamide resin (e.g. GENESTAR from Kuraray Co., Ltd, Tokyo, Japan). In embodiments in which contact materials for chips are more highly reflective than the package material, increasing the area of the contacts with respect to the package floor 140 increases the brightness of the resulting device. In embodiments where the contact materials are less reflective than the package it may be advantageous to reduce the area covered by contacts in relation to the package to increase overall reflectivity.

The chip includes an active region (layers, p-n junction) that emits light in the visible or UV portions of the spectrum, metal contacts in electrical communication with the chip on the package, an encapsulant covering the chip in the package, and, in some embodiments, a phosphor may be included in the encapsulant, which can emit radiation in the visible spectrum of longer wavelengths (lower energy) than that emitted by the chip and in response to the wavelength emitted by the chip. The chip is oriented in a side view orientation and the combination of the wavelengths emitted by the chips or chip and the wavelengths emitted by the phosphor produces white light within the appropriate boundaries on the chromaticity diagram.

The present invention is described herein with reference to certain embodiments, but it is understood that the invention can be embodied in many different forms and should not be construed as limited to the embodiments set forth herein. In particular, the present invention is described below in regards to certain side view surface mount devices, but it is understood that the device can be adapted for other uses. The devices and systems can also be used with many different packages, systems and applications beyond those described herein, with many being LED based.

It is understood that when an element can be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one element to another. It is understood that these terms are intended to encompass different orientations of the device in addition to the orientation depicted in the figures.

Although the ordinal terms first, second, etc., may be used herein to describe various elements, components, regions and/or sections, these elements, components, regions, and/or sections should not be limited by these terms. These terms are only used to distinguish one element, component, region, or section from another. Thus, unless expressly stated otherwise, a first element, component, region, or section discussed below could be termed a second element, component, region, or section without departing from the teachings of the present invention.

As used herein, the term "source", "chip" or "emitter" can be used to indicate a single light emitter or more than one light emitter functioning as a single source. For example, the term may be used to describe a single blue LED, or it may be used to describe a red LED and a green LED in proximity emitting as a single source. Thus, the term "source", "chip" or "emitter" should not be construed as a limitation indicating either a single-element or a multi-element configuration unless clearly stated otherwise.

Embodiments of the invention are described herein with reference to cross-sectional view illustrations that are schematic illustrations. As such, the actual thickness of elements can be different, and variations from the shapes of the illustrations as a result, for example, of manufacturing techniques and/or tolerances are expected. Thus, the elements illustrated in the figures are schematic in nature and their shapes are not intended to illustrate the precise shape of a region of a device and are not intended to limit the scope of the invention.

FIGS. 1-4 show a bottom, top, and side views of a side view surface mount device according to the present disclosure. The figures will be understood to be schematic in nature and thus the shapes and sizes are illustrated for clarity rather than as an exact representation of particular devices.

Traditional side view surface mount devices generally include a number of contact pins protruding from the casing of such a device. These pins are generally attached to a mount surface and electric current is provided through these pins to the emitters within. These pins are generally all placed on one side of the device and oriented in one direction. This can make it difficult to access all the pins and provide an unbalanced device, reducing mounting reliability. Some devices may include several pins which are elongated and bent around corners to provide additional areas of access on other sides of the device. However, these pins have a lower reliability as the elongated and bent portions may break off, which is not desirable.

Figure 1:
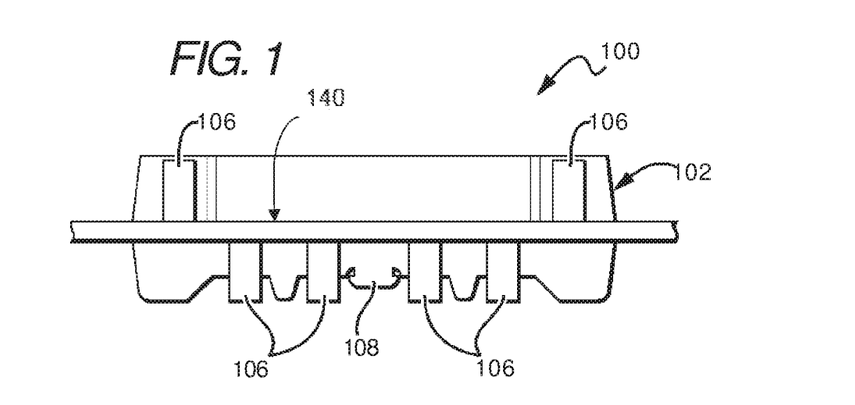
FIG. 1 is a bottom view showing a side view surface mount device according to one embodiment of the present disclosure.

FIG. 1 shows the bottom view of device 100. The device 100 includes a package 102 which, in turn, includes a plurality of contact pins 106 protruding from the bottom surface. These contact pins 106 are provided such that they are along a bottom surface of the package 102 which may contact a mounting surface. In this configuration 6 contact pins 106 are shown providing connections to 3 light emitters 110. However, any number of contact pins may be used to connect to and power any number of light emitters within the device. A subset of the contact pins 106 protrude in an opposite direction on the bottom surface from the remaining contact pins 106. This configuration is different from traditional configurations where all the pins are oriented in the same direction. The present configuration, or variations thereof, offers at least the advantage of a more balanced package, providing easier and more reliable mounting, while still using contact pins accessible from the bottom or mounting surface. Having pins protruding in the opposite direction of the same surface provides balancing characteristics. Additionally, assembly PCB layouts are difficult to design if all the pins are on one side of the device. Furthermore, these pins are disposed on the surface they are accessible from, oriented in different directions, unlike pins which are bent around sides of packages which can be less reliable due to breakage.

Figure 2:
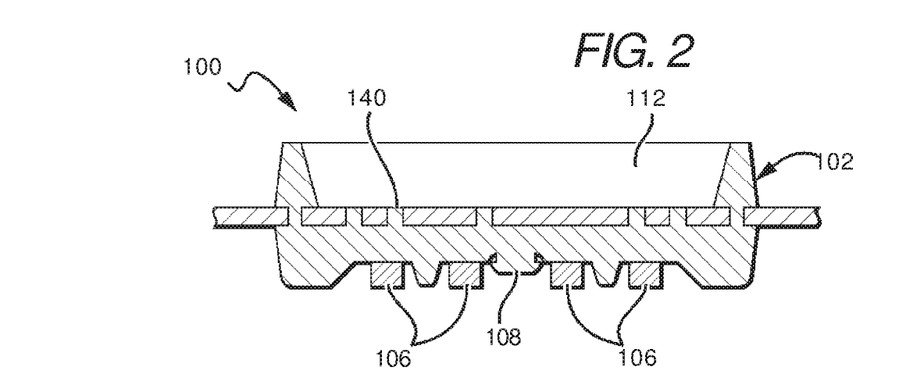
FIG. 2 is a top view showing a side view surface mount device according to one embodiment of the present disclosure.

FIG. 2 is a top view of the device 100 with contact pins 106 on the bottom. As shown, the package 102 has a cavity which can be filled with an encapsulant 112. The cavity, shown in FIG. 4, would include a floor 140 which can accommodate mounting of one or more light emitters 110. The light emitters 110 would have an electrical connection to contact pins 106. This cavity can include reflective surfaces if desired.

Additionally, the cavity can be covered by a lens, filled by an encapsulant, or left as is. In some configurations the encapsulant may include scattering materials, a diffuser, or light conversion materials. The encapsulant partially or fully fills the depression or cavity in the package 102 and may form a meniscus with respect to the other geometry of the package. Additionally, the encapulant may include features that improve light extraction. Some light extraction improving features may include surface texturing, roughening, or shaping; however, any light extraction improving feature may be used. A diffuser can be included in the encapsulant to enhance the light output. As used herein, a diffuser is any particle or surface feature that helps scatter light more efficiently within the encapsulant and thus enhance the overall output. The diffuser is typically a ceramic, and can be selected or tailored with respect to the chip, the package geometry, and the phosphor.

For example, silicon dioxide particles used as the diffuser provide an index of refraction that is nearer in value to the typical encapsulant and thus acts as a "weaker" diffuser. This results in low loss. SiO2 is also easily and widely available. Silicon carbide (SiC) can be used as a diffuser, also with relatively low loss, but its high index of refraction makes it a strong diffuser, which is favored in some circumstances. Silicon carbide is, however, generally harder to work with in small particle sizes than is silicon dioxide. Other ceramics such as titanium dioxide (TiO2) are readily available and can be incorporated as desired. In addition to ceramics, or in addition to dispersing these in the encapsulant, the diffuser can actually be pre-formed in a separate piece and then positioned where desired.

The cavity of FIG. 2 is filled with a substantially transparent encapsulant covering chips 110 in the package 102. Although the encapsulant is not illustrated in FIG. 1, if described schematically it would partially or totally fill the recess or cavity in the package 102 that is defined by the sloping walls and the floor 140 of the cavity.

In some embodiments the encapsulant may include a phosphor. The phosphor would emit radiation in the visible spectrum having lower energy than the radiation emitted by the light emitters and does so in response to the wavelength emitted by the light emitters.

Figure 3:
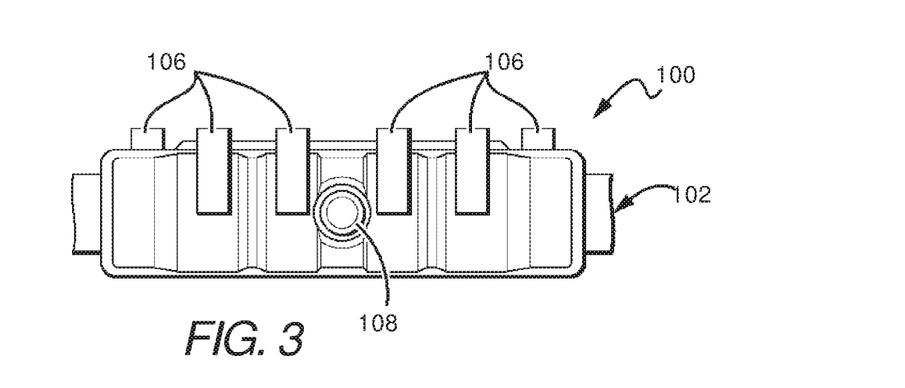
FIG. 3 is back side view showing a side view surface mount device according to one embodiment of the present disclosure.
Figure 4:
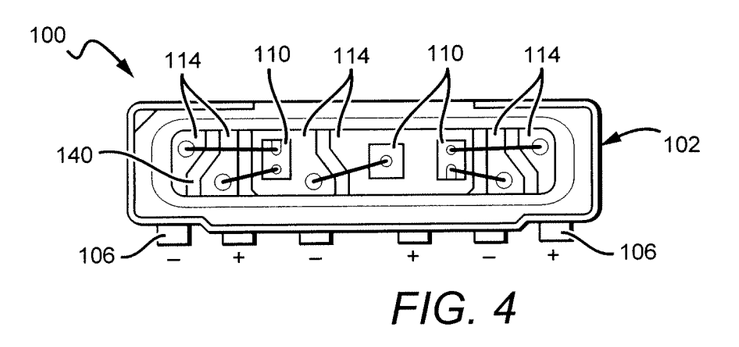
FIG. 4 is front side view showing a side view surface mount device according to one embodiment of the present disclosure.

FIG. 3 shows a back side view of the device 100. This view shows the contact pins 106 and gate 108 protruding from package 102. FIG. 4 shows a front side view of the device 100, showing the cavity in package 102 and the floor 140 of the cavity. The package 102 includes four downwardly sloping (or in some cases vertical) walls that define the recess or cavity which includes a floor 140. A semiconductor chip, or plurality of chips, 110 rests on the floor 140 and thus on the package 102. Although the chip 110 is shown schematically as the rectangle 110, it will be understood that it includes an active region, typically including a number of epitaxial layers and a p-n junction that emits light in the visible or UV portion of the spectrum. The chip may be mounted in a flip chip configuration, or have one or more wire bonds connected to bond pads 114. Typically a conductive portion of a chip 110 is in electrical contact with one of the bond pads 114 while a wire bond connects the chip 110 to the other bond pad 114, as shown with the center chip 110. In other configurations, such as the left most chip, two wire bonds may be used to connect to two bond pads 114. Again although the bond pads are schematically illustrated with particular shapes, it will be understood that portions of the bond pads may be shaped differently in order to fit into an appropriate circuit board complementary device and thus they will be shaped as necessary. However, the tapered portions of the bond pads 114 between the bond pads are a feature which will be discussed in more detail below. In some embodiments the bond pads 114 may be metal lead frame elements.

In various embodiments, a variety of emitters or chips may be used within the device. In some configurations, the emitters may include RGB emitters. Others may include red and green emitters, red emitters, blue emitters, green emitters, or white emitters. In still other configurations, other combinations of numbers and types of emitters may be used. In embodiments using white emitting light emitters, rather than emitters of various colors, the semiconductor chips are formed from wide bandgap semiconductor materials such as silicon carbide (SiC) or the Group III nitrides. Examples include chips from Cree, Inc., Durham, N.C., USA, the assignee herein. See, Cree Products, [online] http://www-.cree.com/productslindex.htm (April 2006). Because of their wide bandgap capabilities, these chips tend to emit in the blue portion of the visible spectrum. Thus, phosphors that emit in the yellow portion of the spectrum are an ideal complement to the blue-emitting diode chips. Exemplary chips can emit at wavelengths as short as 380 nm (i.e., in the UV) and can include chips that operate at forward voltages of 3 volts (V) or less (at 20 milliamps (mA) current). The chips can include roughened or lenticular surfaces or substrates to enhance light extraction.

Combinations of phosphors can be used in conjunction with the blue or UV-emitting chip to create white light; e.g. blue and yellow, blue and green and red, and blue and green and yellow and red. Using three or more colors provides the opportunity to select a particular white point and a better color rendering. It is also expected that LEDs with more than one emission peak will be useful in exciting one or more phosphors to produce white light.

As used herein, and generally in this art, the term "white" is used to describe the output of a device that produces two or more emissions that, when combined, appear as a shade of white to the human eye. In particular, illumination devices are sometimes categorized by their "correlated color temperature" (CCT) which compares the color of a particular device to a reference source heated to a particular temperature. The devices according to the invention have CCT's of at least 4,500K to 8,000K and in some cases 2,700K to 10,000K.

In exemplary embodiments the encapsulant is formed of either single or multiple compositions, which are selected for their physical, optical, and chemical properties. Exemplary compositions for the encapsulant include silicone, epoxy resins, elastomers, certain gels, thermoplastic resins, and acrylic resins. In general, the encapsulant should be transparent within the relevant frequencies, and should resist or be inert to chemical reaction with the materials in the chip, the package, the phosphor, or the diffuser. To the extent possible the encapsulant should resist photochemistry reactions, and should provide the desired environmental protection and necessary physical strength. Each of these particular factors may be more important in particular situations, and thus the best choice may change depending upon the specific application.

The encapsulant's refractive index (IR) should typically range from between about 1.4 and about 1.6. Encapsulants can be further characterized as those with refractive indexes that are somewhat higher (1.5-1.6) or lower (1.4-1.5) within this range. High refractive index encapsulants have advantages but may not transmit as well as lower refractive index materials. Additionally, materials within the refractive index range of 1.4-1.5 tend to be more widely available.

In some embodiments the encapsulant has a negative meniscus. The depth of the meniscus, defined as the distance between the package wall and the meniscus, can be selected for various purposes and typically ranges from (planar meniscus) to 500 microns. A meniscus depth between about 320 and 280 microns provides a narrower viewing angle (90-110°) and higher color uniformity. A depth between about 260 microns provides color uniformity at a wider viewing angle (110-120°).

If desired, the encapsulant can form a dome (lens). In exemplary embodiments the dome can have a height above the top of the package 102 of between about 60 and 400 microns. Depending upon the size and shape of the meniscus 44 or the dome 60, a near-Lambertian far-field pattern can be produced. Certain shapes can help maximize light extraction, but may do so at a cost (i.e., a trade off) of some color uniformity. If desired, however, the placement of the phosphor and the diffuser can be adjusted to obtain a desired result.

As further mentioned in the background, the package can incorporate three chips to form a three-color pixel that produces the white light. A three-color pixel offers the advantage of requiring neither filters nor phosphors to produce white light. Such a pixel will, however, require additional leads and circuitry.

The schematic illustrations tend to show the chip(s) in an aligned fashion with respect to the geometry of the package; e.g., the orientation illustrated in FIG. 4. The chip can, however, be oriented differently (typically rotated in a plane or staggered) to extract light more efficiently. Such orientations can improve color uniformity by specifically avoiding matching the long axis of a rectangular chip with the long axis of a rectangular package.

Figure 5:
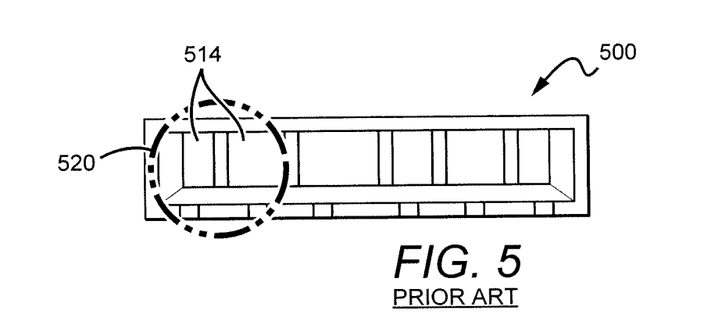
FIG. 5 is a front side view of a prior art side view surface mount device with the bond pad area highlighted.

FIG. 5 is a side view depicting a prior art side view device. The highlighted area 520 of FIG. 5 shows 2 rectangular shaped bond pads 514. The area within the device 500 is limited and therefore organizing the bond pads and other components efficiently is desirable. The shown traditional bond pads 514 have a rectangular shape and are arranged side by side. Therefore, they can only accommodate wire bond balls according to the width of each bond pad, which are the size of less than half the space of the available area for bond pads. The use of square or rectangular bond pads within devices can limit or reduce the size and material of wire ball bonds which can be used.

Figure 6:
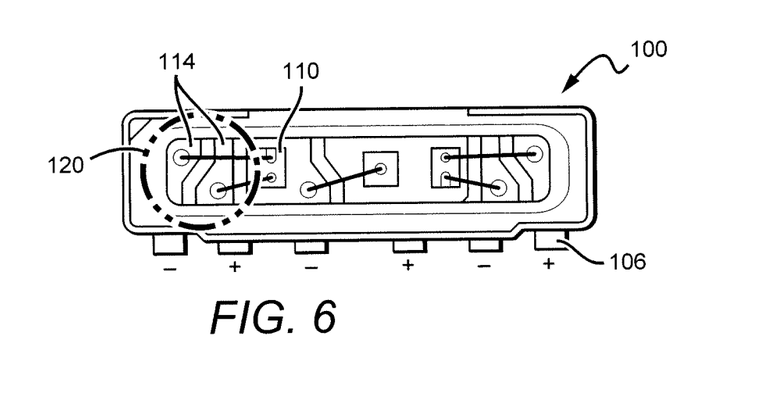
FIG. 6 is a front side view showing a side view surface mount device according to one embodiment of the present disclosure with the bonding pad area highlighted.

FIG. 6 is a front side view of an exemplary side view surface mount device according to the present disclosure. The highlighted area 120 shows tapered bond pads 114 according to an aspect of the present disclosure. These bond pads 114 are disposed in an area similar to those in the highlighted area 520 of FIG. 5. However, these bond pads 114 have a tapered shape, such that the narrower portion of one bond pad 114 is adjacent to the wider portion of a second bond pad 114. This tapered shape allows for larger wire bond balls to be used on each bond pad 114, though the bond pads 114 take up generally the same area as those shown in the highlighted area 520 of FIG. 5. This allows for the use of larger wire ball bonds and the use of a larger variety materials in wire ball bonding, because the size restrictions are reduced or eliminated.

Although not specifically illustrated in the drawings as a separate element, those familiar with diodes recognize that the chip 110 is fixed to the floor 140 in some manner. In some cases, the chip is conductively attached with a material such as silver epoxy or a eutectic metal. Other conductive attachments include conductive tapes and conductive thermoplastic (i.e., a plastic with a second component dispersed therein to create the conductive pathways). Such conductive adhesives are necessary or advantageous in some embodiments, but can provide an additional possibility for light loss. For example, silver epoxy tends to be opaque in use. Thus, its conductive advantages in use will be balanced against potential light loss.

For designs that do not require a direct conductive attachment between the chip and the package, the attachment can be carried out using nonconductive materials. These can include the same (or a related) material as the encapsulant, or a tape (a number of cell phone components are typically attached in this matter) or one of the resins referred to earlier including thermoplastics, epoxies, silicone and acrylics.

Figure 7:
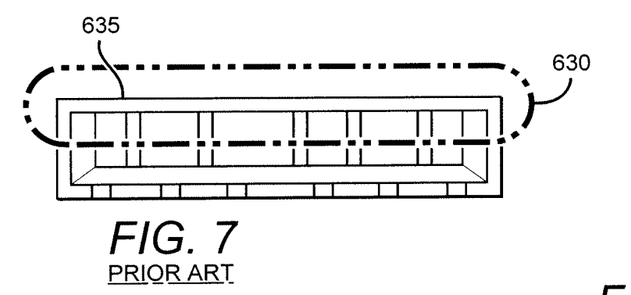
FIG. 7 is a front side view of a prior art side view surface mount device with the top edge area highlighted.

FIG. 7 is a front side view depicting a prior art side view device. The highlighted area 630 of FIG. 7 shows a rectangular shaped device with a flat edge 635. This flat surface or edge 635 provides difficulties in leadframe manufacturing and mold release. An entirely flat surface cannot be released from a plastic PPA mold tool and a mold releasing agent must be used. However, releasing agents may contaminate the package. Replacing this with an edge that is fully sloped may also be problematic as it would be difficult to work with vacuum handling.

Figure 8:
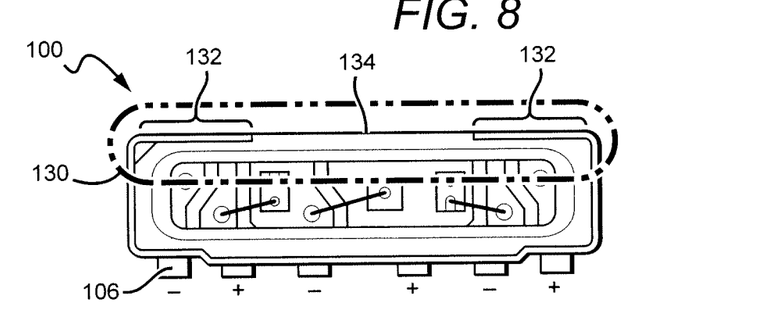
FIG. 8 is a front side view showing a side view surface mount device according to one embodiment of the present disclosure with the top edge area highlighted.

FIG. 8 is a front side view of an exemplary side view surface mount device according to the present disclosure. The highlighted area 130 shows one edge of the device according to an aspect of the present disclosure. As shown, this edge includes two sloped sections 132 and a flat portion 134. Combining sloped and flat sections allows the device to be released from molding tools without the use of a release agent, while still having a flat section which can be used for vacuum handling. Unlike those in the highlighted area 630 of FIG. 7, which include a side that only has a flat portion. Configurations, such as the one shown, allow for the use of mold tools, vacuum handling, and may reduce manufacturing restrictions and inefficiencies.

Figure 9:
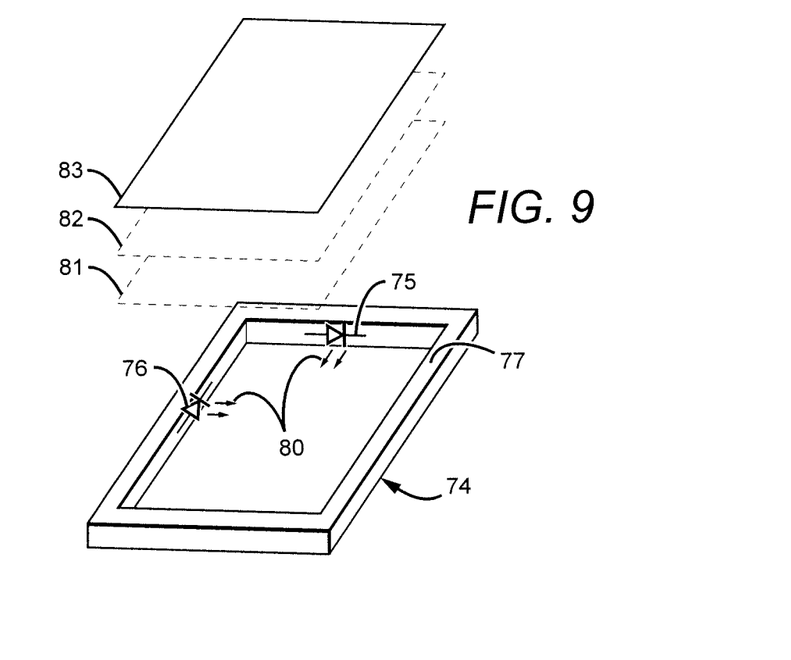
FIG. 9 is a schematic perspective view of a display element incorporating the use of a side view surface mount device according to the present invention.

FIG. 9 is a schematic perspective view diagram of a device according to the present invention in the context of the display element. The display element is broadly designated at 74 and is substantially planar. As noted earlier, the end use of the display 74 can fall within a number of applications with cellular phones, personal digital assistants, and portable gaming devices being currently well recognized categories. Each of these contains a number of design and functional elements that, for the sake of clarity, are not reproduced in FIG. 9. These displays are well understood by persons of ordinary skill in the art, however, and thus the invention can be incorporated into such applications without undue experimentation.

FIG. 9 accordingly illustrates two devices 75 and 76 positioned on the perimeter 77 of the display element 74, and with the arrows 80 illustrating that the devices direct light in a primary direction that is parallel to the plane of the display element 74. The display element 74 can also include additional elements illustrated schematically such as a liquid crystal display 81, one or more color filters 82, and potentially a polarizing film 83.

Although the present invention has been described in detail with reference to certain preferred configurations thereof, other versions are possible. Embodiments of the present invention can comprise any combination of compatible features shown in the various figures, and these embodiments should not be limited to those expressly illustrated and discussed. Therefore, the spirit and scope of the invention should not be limited to the versions described above.

We claim:

1. A light emitting device, comprising:
   a package comprising a cavity with a floor;
   a plurality of light emitting diodes (LEDs) mounted on said floor;
   a plurality of contact pins in electrical contact with said plurality of LEDs, said plurality of contact pins protruding from a first side of said package;
   a second side orthogonal to said first side and opposite a third side, in which at least a first and second of said plurality of contact pins are nearer said second side than said third side and confined to said first side and at least a third, fourth, and fifth of said plurality of contact pins are nearer said third side than said second side, wherein said third, fourth, and fifth pins are between said first and second pins on said first side and said LEDs disposed to emit light toward said second side; and
   a plurality of bond pads on said floor to facilitate electrical connection between said LEDs and said plurality of contact pins, wherein at least one of said bond pads run along said floor without interruption, and wherein at least some of said bond pads have a tapered shape.

2. The light emitting device of claim 1, in which said plurality of contact pins comprise a mount surface such that said package is mountable to a surface, and wherein said LEDs are disposed to emit light in a direction parallel to said mount surface.

3. The light emitting device of claim 2, in which said mount surface is orthogonal to said floor.

4. The light emitting device of claim 1, in which said package further comprises an outer surface orthogonal to said floor, said outer surface comprising at least a sloped portion and a flat portion.

5. The light emitting device of claim 1, in which each of said LEDs emitting different wavelengths of light, said light emitting device capable of emitting a combination of said different wavelengths of light.

6. The light emitting device of claim 5, emitting a white light combination of said different wavelengths.

7. The light emitting device of claim 5, wherein said different wavelengths comprise red, green and blue wavelengths.

8. The light emitting device of claim 5, wherein said different wavelengths of light comprise blue and yellow wavelengths of light.

9. The light emitting device of claim 1, wherein said plurality of LEDs comprise three LEDs.

10. The light emitting device of claim 9, forming a three-color pixel.

11. The light emitting device of claim 1, wherein said plurality of LEDs comprise red, green and blue emitting LEDs.

12. The light emitting device of claim 1, said light emitting device emitting light with a correlated color temperature (CCT) in the range of 2,700 to 10,000K.

13. The light emitting device of claim 1, said light emitting device emitting light with a CCT of at least 4,500 to 8,000K.

14. The light emitting device of claim 1, further comprising a light diffuser.

15. The light emitting device of claim 1, further comprising an encapsulant with a light diffuser that physically scatters light passing through said encapsulant.

\* \* \* \* \*